United States Patent
Sato et al.

(10) Patent No.: US 6,990,130 B2
(45) Date of Patent: Jan. 24, 2006

(54) SEMICONDUCTOR LASER OPTICAL OUTPUT CONTROL CIRCUIT AND OPTICAL DEVICE

(75) Inventors: Katsunori Sato, Tokyo (JP); Takeshi Yuwaki, Kagoshima (JP)

(73) Assignee: Sony Corporation (JP)

( * ) Notice: Subject to any disclaimer, the term of this patent is extended or adjusted under 35 U.S.C. 154(b) by 159 days.

(21) Appl. No.: 10/432,373

(22) PCT Filed: Aug. 23, 2002

(86) PCT No.: PCT/JP02/08491

§ 371 (c)(1),
(2), (4) Date: Sep. 17, 2003

(87) PCT Pub. No.: WO03/019743

PCT Pub. Date: Mar. 6, 2003

(65) Prior Publication Data

US 2004/0057663 A1 Mar. 25, 2004

(30) Foreign Application Priority Data

Aug. 23, 2001 (JP) .................................. 2001-252819

(51) Int. Cl.
*H01S 3/13* (2006.01)

(52) U.S. Cl. ................................ 372/38.02; 372/29.01
(58) Field of Classification Search .............. 372/29.01, 372/38.02
See application file for complete search history.

(56) References Cited

U.S. PATENT DOCUMENTS

| | | | | |
|---|---|---|---|---|
| 4,355,395 A | * | 10/1982 | Salter et al. | ........... 372/29.012 |
| 4,855,988 A | * | 8/1989 | Shinbayashi et al. | ........ 369/116 |
| 5,127,015 A | * | 6/1992 | Chikugawa et al. | ..... 372/29.01 |
| 5,224,112 A | * | 6/1993 | Uesaka | ................... 372/38.02 |
| 5,513,197 A | * | 4/1996 | Koishi | ..................... 372/38.07 |
| 5,568,464 A | | 10/1996 | Horie | |
| 5,570,195 A | * | 10/1996 | Honbo | ....................... 358/302 |
| 5,887,010 A | | 3/1999 | Arai | |
| 6,377,594 B1 | | 4/2002 | Miller | |
| 6,466,595 B2 | * | 10/2002 | Asano | ................... 372/29.021 |
| 6,490,302 B1 | * | 12/2002 | Koishi et al. | ............ 372/38.02 |
| 6,683,836 B2 | * | 1/2004 | Miyagawa et al. | ...... 369/53.26 |
| 6,798,728 B2 | * | 9/2004 | Ota et al. | .................... 369/116 |

FOREIGN PATENT DOCUMENTS

| | | |
|---|---|---|
| JP | 05-299738 A1 | 11/1993 |
| JP | 06-003612 A1 | 1/1994 |
| JP | 7-141677 A1 | 6/1995 |
| JP | 09-063093 | 3/1997 |
| JP | 09-115167 | 5/1997 |
| JP | 2001-067707 A | 3/2001 |
| JP | 2001-194242 A1 | 7/2001 |

OTHER PUBLICATIONS

International Search Report Dec. 10, 2002.

* cited by examiner

*Primary Examiner*—Minsun Oh Harvey
*Assistant Examiner*—Phillip Nguyen
(74) *Attorney, Agent, or Firm*—Rader, Fishman & Grauer PLLC; Ronald P. Kananen

(57) ABSTRACT

A semiconductor laser optical output control circuit able to precisely control an optical output of a semiconductor laser, provided with a peak value detection circuit 106-1 and a bottom value detection circuit 107-1 for detecting the output of a photo-diode PD 102, optical power setting voltage sources 105-1 and 105-2 for giving the setting value of the optical output of a semiconductor laser LD 101, a peak value detection circuit 106-2 and a bottom value detection circuit 107-2 for detecting the output of a switching circuit 104 for switching the setting value, error amplifiers 108-1 and 108-2 for comparing the detected outputs of the peak value detection circuit 106-1 and peak value detection circuit 106-2 and the bottom value detection circuit 107-1 and bottom value detection circuit 107-2, and a switching circuit 110 for switching the comparison results of the error amplifiers 108-1 and 108-2 and supplying the same to a current amplifier 111 in synchronization with the switching circuit 104.

19 Claims, 18 Drawing Sheets

SEMICONDUCTOR LASER OPTICAL OUTPUT CONTROL CIRCUIT AND OPTICAL DEVICE

TECHNICAL FIELD

The present invention relates to a semiconductor laser optical output control circuit for controlling an optical output of a semiconductor laser widely used as a light source of an optical disk device, an optical communication apparatus, and a laser printer and an optical device provided with the same.

BACKGROUND ART

A semiconductor laser is extremely small sized and responds to a drive current at a high speed, so is widely used as a light source of an optical disk device, optical communication apparatus, and laser printer.

As a rewritable optical disk, a phase change optical disk and a magneto-optic disk are widely known. The two are, however, different in the output of the laser beam emitted when recording, reproducing, and erasing. For example, by emitting a laser beam having a laser power at the time of reproduction lower than that at the time of recording, the information is read out without destroying the recorded bits.

An optical disk device emits converged light of the semiconductor laser to the optical disk and obtains an information signal and a servo signal from the optical disk, therefore the light reflected from the optical disk is returned to the semiconductor laser side as well to a certain extent. Scoop noise and mode hopping noise due to interference between this returned light and the emitted light occur and become causes of inducing C/N deterioration of the reproduction signal.

The high frequency superimposition method is known for reducing these. According to this high frequency superimposition method, in the reproduction mode, a high frequency current of 200 MHz to 600 MHz is superimposed on a DC bias current of the semiconductor laser.

In the recording mode, along with higher recording densities and higher speed transfers, use is being made of a modulation system as shown in FIG. 1A combining pulse width modulation and intensity modulation.

In this case, it is necessary to set the intensity of the laser beam emitted to a plurality of levels (four of P1 to P4 in the example of FIG. 1A). The shortest pulse width is also up to about several nsec.

In the example of FIG. 1A, the level set becomes P1>P2>P3>P4.

In the case of the control of these four values, P1 is the peak level and P4 is the bottom level. P2 and P3 are predetermined levels between the peak and the bottom (intermediate value level). For example, the erasing power for an optical disk capable of overwrite is set to the intermediate level P3. In this case, as shown in FIGS. 1A and 1B, P3 is set for portions forming spaces between recording marks RMK.

In a high density and high transfer rate optical disk, in order to obtain an error rate enabling recording and reproduction, it is required to sufficiently control the intensity of the laser beam in the different modes of recording, reproduction, and erasing.

However, a semiconductor laser changes remarkably in drive current and optical output characteristic depending on the temperature characteristic, so an APC (auto power control) circuit, i.e., a so-called semiconductor laser optical output control circuit, becomes necessary in order to set the optical output of the semiconductor laser at a desired intensity.

This APC circuit is generally roughly classified into two types according to its control system.

The first system monitors the optical output of the semiconductor laser by a light receiving element and forms an opto-electric negative feedback loop for constantly controlling the drive current of the semiconductor laser so that the light receiving current generated in this light receiving element (proportional to the optical output of the semiconductor laser) and a light emission instruction signal become equal.

The second system monitoring method is the sample/hold system monitoring the optical output of the semiconductor laser by the light receiving element when setting the power, forming an opto-electric negative feedback loop for controlling the drive current of the semiconductor laser so that the light receiving current generated in this light receiving element (proportional to the optical output of the semiconductor laser) and the light emission instruction signal become equal, holding the control value of this drive current even other than when setting the power, and modulating based on this held control value other than when setting this power.

The first system is desirable in each mode of the recording mode and the reproduction mode, but in power control in the recording mode, a plurality of power levels are set and the pulse width thereof is a small one of several nsec; therefore realization of the first system is difficult due to the limit on the operation speed of the light receiving element and the operation speed of the opto-electric negative feedback loop. Due to such a reason, an APC circuit performing control by the second system has been used in both of the modes.

FIG. 2 is a circuit diagram of an example of the configuration of an APC circuit (semiconductor laser optical output control circuit) employing the second system (refer to for example Japanese Unexamined Patent Publication (Kokai) No. 9-63093 and Japanese Unexamined Patent Publication (Kokai) No. 9-115167).

This APC circuit has a laser diode (LD) 1 as the semiconductor laser to be controlled, laser power monitor use photo diode (PD) 2, current/voltage conversion circuit (I/V) 3, error amplifier 4, optical power setting voltage use switching circuit 5, optical power setting voltage sources 6-1, 6-2, . . . , 6-$n$, sample/hold circuits (S/H) 7-1, 7-2, . . . , 7-$n$, voltage/current conversion circuits (V/I) 8-1, 8-2, . . . , 8-$n$, switching circuit 9, current amplifier 10, control terminals T71, T72, . . . , T7$n$ provided in the sample/hold circuits 7-1, 7-2, . . . , 7-$n$, and control terminal T9 of the switching circuit 9.

The LD 1 outputs the laser beam to be emitted to the optical disk. The PD 2 monitors the optical output of the LD 1.

The current/voltage conversion circuit 3 converts the output current of the PD 2 to a voltage which it supplies to the error amplifier 4. The error amplifier 4 detects a difference between the output voltage of the current/voltage conversion circuit 3 and the optical power setting voltage and outputs it as an error voltage to the sample/hold circuits 7-1, 7-2, . . . , 7-$n$.

The optical power setting voltage use switching circuit 5 selects one of the optical power (laser power) setting voltages V61, V62, . . . , V6$n$ by the optical power setting voltage sources 6-1, 6-2, . . . , 6-$n$ and supplies the same to the error amplifier 4.

The sample/hold circuits 7-1, 7-2, ..., 7-n sample control voltages output by the error amplifier 4 in accordance with the levels of sample gate signals input via the control terminals T71, T72, ..., T7n, hold them, and supply the held voltages V1, V2, ..., Vn to the voltage/current conversion circuits 8-1, 8-2, ..., 8-n.

The voltage/current conversion circuits 8-1, 8-2, ..., 8-n convert the outputs of the sample/hold circuits 7-1, 7-2, ..., 7-n from voltage signals to current signals I1, I2, ..., In.

The switching circuit 9 switches the output currents I1, I2, ..., In of the voltage/current conversion circuits 8-1, 8-2, ..., 8-n in accordance with a switch timing signal SWT input via the control terminal T9 and supplies them to the current amplifier 11.

The current amplifier 11 amplifies the current signals as the outputs of the voltage/current conversion circuits 8-1, 8-2, ..., 8-n switched by the switching circuit 9 and drives the LD 1 by the amplified current signal.

Next, an explanation will be given of the operation of the circuit of FIG. 2 with reference to FIGS. 3A to 3F.

For example, in the format FMT of a magneto-optic disk, as shown in FIG. 3A, before a data portion (DT) 114 serving as the recording region of each sector SCT, an address portion (ADR) 115 recording the address of the sector SCT therein and an ALPC (auto laser power control) portion 116 for setting optical power levels of the reproduction, erasing, and recording are provided.

In the address portion 115, the address information is read out in the reproduction mode. In the ALPC portion 116, the optical power levels are sequentially set in time series as shown in FIGS. 3B to 3E.

In the other section, currents I1 to In output by the voltage/current conversion circuits 8-1, 8-2, ..., 8-n based on the control values V1 to Vn held by the sample/hold circuits 7-1, 7-2, ..., 7-n are selected by the switching circuit 9, and the LD 1 is driven to emit light by the drive current ILD multiplied by K by the current amplifier 10. The optical output waveform set in this ALPC region 16 is shown in FIG. 3F.

When the sample gate signal SMGT input to the control terminal T71 of the sample/hold circuit 7-1 is set at the 'High' level, the output voltage of the current/voltage conversion circuit 3 and the optical power setting voltage V61 are compared by the error amplifier 4, the LD 1 is driven based on the control voltage V1 output by the error amplifier 4, and the laser power is set.

By setting this loop band at about several MHz, a pull-in operation is sufficiently carried out on the setting of the laser power by 1 $\mu$sec. The control voltage of this laser power is held at the sample/hold circuit 7-1 by making the sample gate signal SPGT to be given to the control terminal T71 of the sample/hold circuit 7-1 the 'Low' level. The other optical powers are similarly sequentially set.

Subsequently, in the data portion 114 of the sector, the current outputs of the voltage/current conversion circuits 8-1, 8-2, ..., 8-n generated by these held control voltages are switched by the switching circuit 9. By this, the recording light emission waveform shown in FIG. 1A and the DC light emission of reproduction and erasure by the LD 1 become possible.

At the time of driving this LD 1, the APC circuit has become an open loop, so it is possible to easily generate the high speed pulse drive current ILD of the recording mode.

However, the laser power setting section of several $\mu$sec of this ALPC region is a considerably long period compared with the period of generation of the laser pulse at the time of recording, so there is an effect on the service life of the LD 1 (semiconductor laser). Further, in a semiconductor laser, by injecting a forward direction current to a PN junction to form an inversion distribution and changing the injection current, the inversion distribution changes. Along with this, the frequency of induction discharge changes and the intensity of the laser beam changes. This response is high speed, so modulation by the pulse current is possible, but there is the defect of the appearance of relaxation oscillation in the optical pulse.

A general electrical equivalent circuit of a semiconductor laser is represented by an RLC parallel circuit as shown in FIG. 4 and includes a DC resistor Rd, a parallel capacitor Cd, an inductor Lw of a lead, and a package capacitor Cp. The inductor Lw and parallel capacitor Cd form a low pass filter which governs the modulation band of the laser.

Due to the above, there are many factors for fluctuation in the pulse light emission characteristic of a semiconductor laser. Even among semiconductor lasers of the same type, there is considerable fluctuation due to the variation among lots.

When a step-like drive current is supplied to a semiconductor laser, there is a droop characteristic where the optical output changes along with a temperature rise of the semiconductor laser.

Due to this, a difference arises between the optical power set at the ALPC portion 116 and the pulse light emission power at the time of recording.

Further, as mentioned above, in the recording mode, along with higher recording densities and higher speed transfers, the modulation systems shown in FIGS. 1A and 1B are being adopted. In this case, it is necessary to set a plurality of intensities of the laser beam emitted.

In this case, the power is sequentially set in time series and a sufficient ALPC region is increasingly harder to secure.

DISCLOSURE OF THE INVENTION

An object of the present invention is to provide a semiconductor laser optical output control circuit able to precisely control the optical output of a semiconductor laser pulse driven by a plurality of settings and an optical device provided with the same.

To attain the above object, a first aspect of the present invention is a semiconductor laser optical output control circuit for controlling an optical output of a semiconductor laser to a desired intensity in accordance with a supplied drive current, comprising an optical output detecting means for detecting the optical output of the semiconductor laser; a first detecting means for detecting a first level of the optical output detected by the optical output detecting means; a second detecting means for detecting a second level of the optical output detected by the optical output detecting means; a first optical output setting means for giving a first setting value of a first level in the optical output of the semiconductor laser; a second optical output setting means for giving a second setting value of a second level in the optical output of the semiconductor laser; a first switching means for switching and first and second setting value signals of the optical output given by the first and second optical output setting means; a third detecting means for detecting the first setting value signal among outputs of the optical output setting switching means; a fourth detecting means for detecting the second setting value signal among the outputs of the optical output setting switching means; a first comparing means for comparing the detected output of the first detecting means with the detected output of the third detecting means and outputting the comparison result; a second comparing means for comparing the detected output of the second detecting means with the detected output of the fourth detecting means and outputting the comparison result; a second switching means for switching and outputting the comparison results of the first and second comparing means in synchronization with the switching by the first switching means; and a current supplying means for supplying the drive current in accordance with the output signal of the second switching means to the semiconductor laser.

Preferably, the first detecting means and third detecting means include peak value detection circuits, and the second detecting means and fourth detecting means include bottom value detection circuits.

More preferably, the peak value detection circuits of the first detecting means and third detecting means have substantially the same circuit output characteristics, and the bottom value detection circuits of the second detecting means and fourth detecting means have substantially the same circuit output characteristics.

Alternatively, preferably, provision is made of first and second hold circuits for holding the comparison results output by the first and second comparing means, and the second switching means switches the comparison results held by the first and second hold circuits and supplies the switched comparison results to the current supplying means.

Alternatively, the optical output setting means gives the setting of the semiconductor laser as a reference voltage value. Alternatively, the optical output setting means gives the setting of the semiconductor laser as a reference current value.

A second aspect of the present invention is a semiconductor laser optical output control circuit for controlling an optical output of a semiconductor laser to a desired intensity in accordance with a supplied drive current, comprising an optical output detecting means for detecting the optical output of the semiconductor laser; a first detecting means for detecting a first level of the optical output detected by the optical output detecting means; a second detecting means for detecting a second level of the optical output detected by the optical output detecting means; a third detecting means for detecting a third level intermediate between the first level and second level of the optical outputs detected by the optical output detecting means; a first optical output setting means for giving a first setting value of a first level in the optical output of the semiconductor laser; a second optical output setting means for giving a second setting value of a second level in the optical output of the semiconductor laser; at least one third optical output setting means for giving a third setting value of a third level in the optical output of the semiconductor laser; a first switching means for switching and outputting the first, second, and third setting value signals of the optical outputs given by the first, second, and third optical output setting means; a fourth detecting means for detecting the first setting signal among the outputs of the optical output setting switching means; a fifth detecting means for detecting the second setting signal among the outputs of the optical output setting switching means; at least a sixth detecting means for detecting the third setting value signal among the outputs of the optical output setting switching means; a first comparing means for comparing the detected output of the first detecting means with the detected output of the fourth detecting means and outputting the comparison result; a second comparing means for comparing the detected output of the second detecting means with the detected output of the fifth detecting means and outputting the comparison result; at least one third comparing means for comparing the detected output of the third detecting means with the detected output of the sixth detecting means and outputting the comparison result; a second switching means for switching and outputting the comparison results of the first, second, and third comparing means in synchronization with the switching by the first switching means; and a current supplying means for supplying the drive current in accordance with the output signal of the second switching means to the semiconductor laser.

Preferably, the first detecting means and fourth detecting means include peak value detection circuits, the second detecting means and fifth detecting means include bottom value detection circuits, and the third detecting means and sixth detecting means include mean value detection circuits.

More preferably, the peak value detection circuits of the first detecting means and fourth detecting means have substantially the same circuit output characteristics, the bottom value detection circuits of the second detecting means and fifth detecting means have substantially the same circuit output characteristics, and the mean value detection circuits of the third detecting means and sixth detecting means have substantially the same circuit output characteristics.

Further, at least the mean value detection circuit among the peak value detection circuit, bottom value detection circuit, and mean value detection circuit has a hold function.

Alternatively, the first, second, and third comparing means have a hold function.

Alternatively, provision is made of first, second, and third hold circuits for holding the comparison results output of the first, second, and third comparing means, and the second switching means switches the comparison results held by the first, second, and third hold circuits and supplies the switched comparison result to the current supplying means.

A third aspect of the present invention is an optical device comprising a semiconductor laser optical output control circuit for controlling an optical output of the semiconductor laser emitted to an optical medium to a desired intensity in accordance with a supplied drive current, wherein the semiconductor laser optical output control circuit comprises an optical output detecting means for detecting the optical output of the semiconductor laser; a first detecting means for detecting a first level of the optical output detected by the optical output detecting means; a second detecting means for detecting a second level of the optical output detected by the optical output detecting means; a first optical output setting means for giving a first setting value of a first level in the optical output of the semiconductor laser; a second optical output setting means for giving a second setting value of a second level in the optical output of the semiconductor laser; a first switching means for switching and outputting first and second setting value signals of the optical output given by the first and second optical output setting means; a third detecting means for detecting the first setting value signal among outputs of the optical output setting switching means; a fourth detecting means for detecting the second setting value signal among the outputs of the optical output setting switching means; a first comparing means for comparing the detected output of the first detecting means with the detected output of the third detecting means and outputting the related comparison result; a second comparing means for comparing the detected output of the second detecting means with the detected output of the fourth detecting means and outputting the comparison result; a second switching means for switching and outputting the comparison results of the first and second comparing means in synchronization with the switching by the first switching means; and a current supplying means for supplying the drive current in accordance with the output signal of the second switching means to the semiconductor laser.

A fourth aspect of the present invention is an optical device comprising a semiconductor laser optical output control circuit for controlling an optical output of a semiconductor laser emitted to an optical medium to a desired intensity in accordance with a supplied drive current, wherein the semiconductor laser optical output control circuit comprises an optical output detecting means for detecting the optical output of the semiconductor laser; a first detecting means for detecting a first level of the optical output detected by the optical output detecting means; a second detecting means for detecting a second level of the optical output detected by the optical output detecting means; a third detecting means for detecting a third level intermediate between the first level and second level of the optical outputs detected by the optical output detecting means; a first optical output setting means for giving a first setting value of a first level in the optical output of the semiconductor laser; a second optical output setting means for giving a second setting value of a second level in the optical output of the semiconductor laser; at least one third optical output setting means for giving a third setting value of a third level in the optical output of the semiconductor laser; a first switching means for switching and outputting the first, second, and third setting value signals of the optical outputs given by the first, second, and third optical output setting means; a fourth detecting means for detecting the first setting value signal among the outputs of the optical output setting switching means; a fifth detecting means for detecting the second setting value signal among the outputs of the optical output setting switching means; at least a sixth detecting means for detecting the third setting value signal among the outputs of the optical output setting switching means; a first comparing means for comparing the detected output of the first wave detecting means with the detected output of the fourth detecting means and outputting the comparison result; a second comparing means for comparing the detected output of the second detecting means with the detected output of the fifth detecting means and outputting the comparison result; at least one third comparing means for comparing the detected output of the third detecting means with the detected output of the sixth detecting means and outputting the comparison result; a second switching means for switching and outputting the comparison results of the first, second, and third comparing means in synchronization with the switching by the first switching means; and a current supplying means for supplying the drive current in accordance with the output signal of the second switching means to the semiconductor laser.

The present invention detects the optical output of the semiconductor laser by the optical output detecting means, detects the first level (for example, peak value) of the detected optical output by the first detecting means, detects for example the setting value of the optical output in the recording mode by the third detecting means, detects the second level (for example, bottom value) of the detected optical output by the second detecting means, and detects for example the setting value of the optical output in the recording mode by the fourth detecting means.

Further, it compares the detected outputs of the first and third detecting means by the first comparing means, compares the detected outputs of the second and fourth detecting means by the second comparing means, supplies the comparison results to the current supplying means for driving the semiconductor laser, and controls the optical output of the semiconductor laser by the current supplying means.

At this time, it switches the setting value of the optical output and the comparison result of the comparing means in synchronization, realizes pulse drive of the semiconductor laser at the time of recording and further pulse drive at the time of setting the power, and enables control of the optical output of a semiconductor laser driven by a plurality of setting values with a high precision.

BEST MODE FOR WORKING THE INVENTION

Below, embodiments of the present invention will be explained with reference to the attached drawings.

First Embodiment

Figure 5:
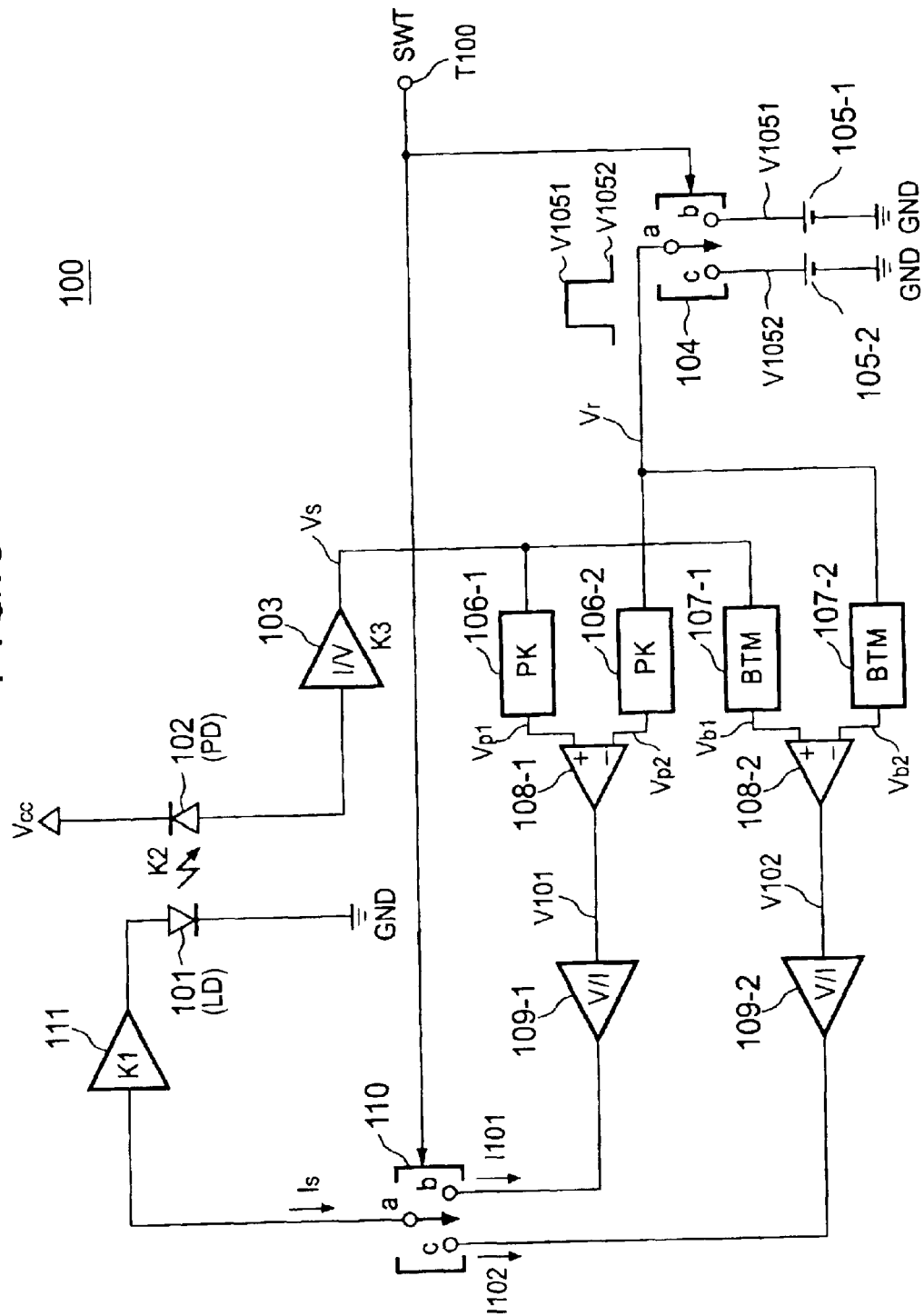
FIG. 5 is a circuit diagram of a first embodiment of a semiconductor laser optical output control circuit according to the present invention.

FIG. 5 is a circuit diagram of a first embodiment of a semiconductor laser optical output control circuit according to the present invention.

Note that, in FIG. 5, since the present invention covers only the recording mode, a high frequency superimposition circuit required in the reproduction mode is omitted. Also, FIG. 5 is a case where there are two optical power settings in the recording mode.

This semiconductor laser optical output control circuit 100 has a LD (laser diode) 101 as the semiconductor laser, a PD (photo diode) 102 as the optical output detecting means for monitoring the optical output of the LD 101, a current/voltage conversion circuit (I/V) 103, an optical power setting voltage use switching circuit (first switching means) 104, optical power setting voltage sources 105-1 and 105-2, a peak value detection circuit (first wave detecting means) 106-1, a peak value detection circuit (third wave detecting means) 106-2, a bottom value detection circuit (second wave detecting means) 107-1, bottom value detection circuit (fourth wave detecting means) 107-2, an error amplifier (first comparing means) 108-1, an error amplifier (second comparing means) 108-2, voltage/current conversion circuits (V/I) 109-1 and 109-2, a switching circuit (second switching means) 110, a current amplifier (current supplying means) 111, and a control terminal T100 supplied with a switch timing signal SWT for driving the switching circuits 104 and 110 in synchronization.

The LD 101 outputs a laser beam to be emitted to a not illustrated optical disk.

The PD 102 monitors the optical output of the LD 101 and supplies a monitor current Ipd to the current/voltage conversion circuit 103.

The current/voltage conversion circuit 103 converts the monitor current Ipd of the PD 102 to the voltage and supplies the converted voltage signal Vs to the peak value detection circuit 106-1 and the bottom value detection circuit 107-1.

The optical power setting voltage use switching circuit 104 is connected at its fixed contact a to the inputs of the peak value detection circuit 106-2 and the bottom value detection circuit 107-2, connected at its contact b to the optical power setting voltage source 105-1, and connected at its contact c to the optical power setting voltage source 105-2.

When for example the switch timing signal SWT is at the first level (for example, high level), the switching circuit 104 connects the fixed contact a and the contact b and supplies an optical power (laser power) setting voltage V1051 of the optical power setting voltage source 105-1 as the voltage signal Vr to the peak value detection circuit 106-2 and the bottom value detection circuit 107-2. On the other hand, when the switch timing signal SWT is at the second level (for example low level), the switching circuit 104 connects the fixed contact a and the contact c and supplies an optical power (laser power) setting voltage V1052 (V1052<V1051) of the optical power setting voltage source 105-2 as the voltage signal Vr to the peak value detection circuit 106-2 and the bottom value detection circuit 107-2.

Figure 6:
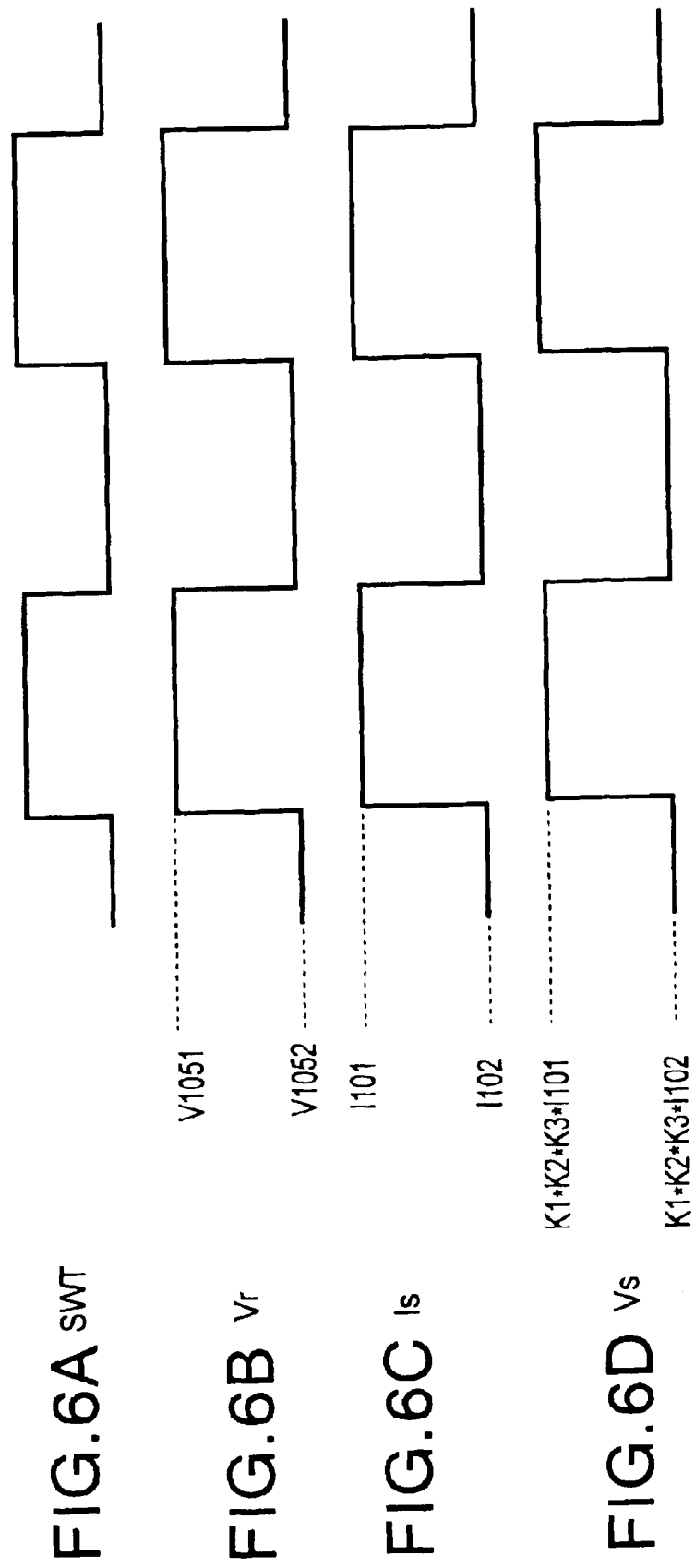
FIGS. 6A to 6D are waveform diagrams of a switch timing signal, an output current Is, an output voltage Vr, and an output voltage Vs in the semiconductor laser optical output control circuit of FIG. 5.

As a result, the voltage signal Vr output from the switching circuit 104 is supplied as a pulse-like signal vr having a peak value of V1051 and having a bottom value of V1052 as shown in FIG. 6B to the peak value detection circuit 106-2 and the bottom value detection circuit 107-2.

The peak value detection circuit 106-1 detects the peak value of the voltage signal Vs by the current/voltage conversion circuit 103 and outputs the same as a signal Vp1 to the error amplifier 108-1.

The peak value detection circuit 106-2 detects the peak value of the voltage signal Vr by the switching circuit 104 and outputs the same as a signal Vp2 to the error amplifier 108-1.

The bottom value detection circuit 107-1 detects the bottom value of the voltage signal Vs by the current/voltage conversion circuit 103 and outputs the same as a signal Vb1 to the error amplifier 108-2.

The bottom value detection circuit 107-2 detects the bottom value of the voltage signal Vr by the switching circuit 104 and outputs the same as a signal Vb2 to the error amplifier 108-2.

The peak value detection circuits 106-1 and 106-2 and the bottom value detection circuits 107-1 and 107-2 have the same configurations.

The error amplifier 108-1 receives as input the output signal Vp1 of the peak value detection circuit 106-1 at its noninverted input (+), receives as input the output signal Vp2 of the peak value detection circuit 106-2 at its inverted input (−), compares the peak values Vp1 and Vp2 to detect the difference, generates the control voltage V101, and outputs the same to the voltage/current conversion circuit 109-1.

The error amplifier 108-2 receives as input the output signal Vb1 of the bottom value detection circuit 107-1 at its noninverted input (+), receives as input the output signal Vb2 of the bottom value detection circuit 107-2 at its inverted input (−), compares the bottom values Vb1 and Vb2 to detect the difference, generates the control voltage V102, and outputs the same to the voltage/current conversion circuit 109-2.

The voltage/current conversion circuit 109-1 converts the control voltage V101 by the error amplifier 108-1 from a voltage signal to a current signal I101 and supplies the same to the switching circuit 110.

The voltage/current conversion circuit 109-2 converts the control voltage V102 by the error amplifier 108-2 from a voltage signal to a current signal I102 and supplies the same to the switching circuit 110.

The switching circuit 110 is connected at its fixed contact a to the input of the current amplifier 111, connected in its contact b, to the output of the voltage/current conversion circuit 109-1, and connected in its contact c to the output of the voltage/current conversion circuit 109-2.

When for example the switch timing signal SWT is at the first level (for example high level), the switching circuit 110 connects the fixed contact a and the contact b and supplies the current signal I101 by the voltage/current conversion circuit 109-1 as is to the current amplifier 111. On the other hand, when for example the switch timing signal SWT is at the second level (for example low level), the switching circuit 110 connects the fixed contact a and the contact c and supplies the current signal I102 by the voltage/current conversion circuit 109-2 as is to the current amplifier 111.

The current amplifier 111 amplifies the current signals I101 and I102 as the outputs of the voltage/current conversion circuits 109-1 and 109-2 switched at the switching circuit 110 and drives the LD 101 by the amplified current signal ILD.

Next, the operation by the above configuration will be explained with reference to FIGS. 6A to 6D.

When generating the control voltages V101 and V102 based on the optical power setting voltages V1051 and V1052, the same switch timing signal SWT shown in FIG. 6A is given to the switching circuits 104 and 110 via the control terminal T100.

Also, the waveforms of the output current Is of the switching circuit 110 and the output voltage Vr of the switching circuit 104 are shown by FIGS. 6B and 6C.

Here, where the gain of the current amplifier 111 is K1, the efficiency of the optical system of PD 102 with respect to the LD 101 is K2, and a transimpedance of the current/voltage conversion circuit 103 is K3, the output voltage Vs of this current/voltage conversion circuit 103 becomes as shown in FIG. 6D.

The output voltage Vs of the current/voltage conversion circuit 103 is input to the peak value detection circuit 106-1 and the bottom value detection circuit 107-1, and the output voltage Vr of the switching circuit 104 is similarly input to the peak value detection circuit 106-2 and the bottom value detection circuit 107-2. Further, as mentioned above, the circuit configurations of the peak value detection circuits 106-1 and peak value detection circuit 106-2 and of the bottom value detection circuit 107-1 and bottom value detection circuit 107-2 are the same.

Accordingly, if the output voltage Vs of the current/voltage conversion circuit 103 and the output voltage Vr of the switching circuit 104 are the same, the output voltages Vp1 and Vp2 of the peak value detection circuit 106-1 and peak value detection circuit 106-2 and the output voltages Vb1 and Vb2 of the bottom value detection circuit 107-1 and bottom value detection circuit 107-2 become equal.

The output voltages Vp1 and Vp2 of the peak value detection circuit 106-1 and the peak value detection circuit 106-2 are supplied to the error amplifier 108-1, while the output voltages Vb1 and Vb2 of the bottom value detection circuit 107-1 and the bottom value detection circuit 107-2 are supplied to the error amplifier 108-2.

The control voltage V101 of the peak value is output from the error amplifier 108-1 to the voltage/current conversion circuit 109-1, while the control voltage V102 of the bottom value is output from the error amplifier 108-2 to the voltage/current conversion circuit 109-2.

The voltage/current conversion circuit 109-1 converts the control voltage V101 of the error amplifier 108-1 from a voltage signal to the current signal I101 and supplies it to the switching circuit 110. Similarly, the voltage/current conversion circuit 109-2 converts the control voltage V102 of the error amplifier 108-2 from a voltage signal to the current signal I102 and supplies it to the switching circuit 110.

The switching circuit 110 selects the current signal I101 of the current/voltage conversion circuit 109-1 or the current signal I102 of the voltage/current conversion circuit 109-2 in accordance with the switch timing signal SWT and supplies it as is to the current amplifier 111.

Then, the current amplifier 111 amplifies the current signals I101 and I102 as the outputs of the voltage/current conversion circuits 109-1 and 109-2 switched at the switching circuit 110 with the gain K1. The LD 101 is driven by the amplified current signal ILD.

By this, the PD 102 monitors the optical output of the LD 101 and supplies the monitor current Ipd to the current/voltage conversion circuit 103. The current/voltage conversion circuit 103 converts the monitor current Ipd of the PD102 to voltage and supplies the converted voltage signal Vs to the peak value detection circuit 106-1 and the bottom value detection circuit 107-1.

In this feedback loop, the set powers are not sequentially set in time series, but are controlled so that the set voltage V1051 and K1*K2*K3*I101 and the set voltage V1052 and K1*K2*K3*I2 simultaneously become equal in the setting section.

Figure 3:
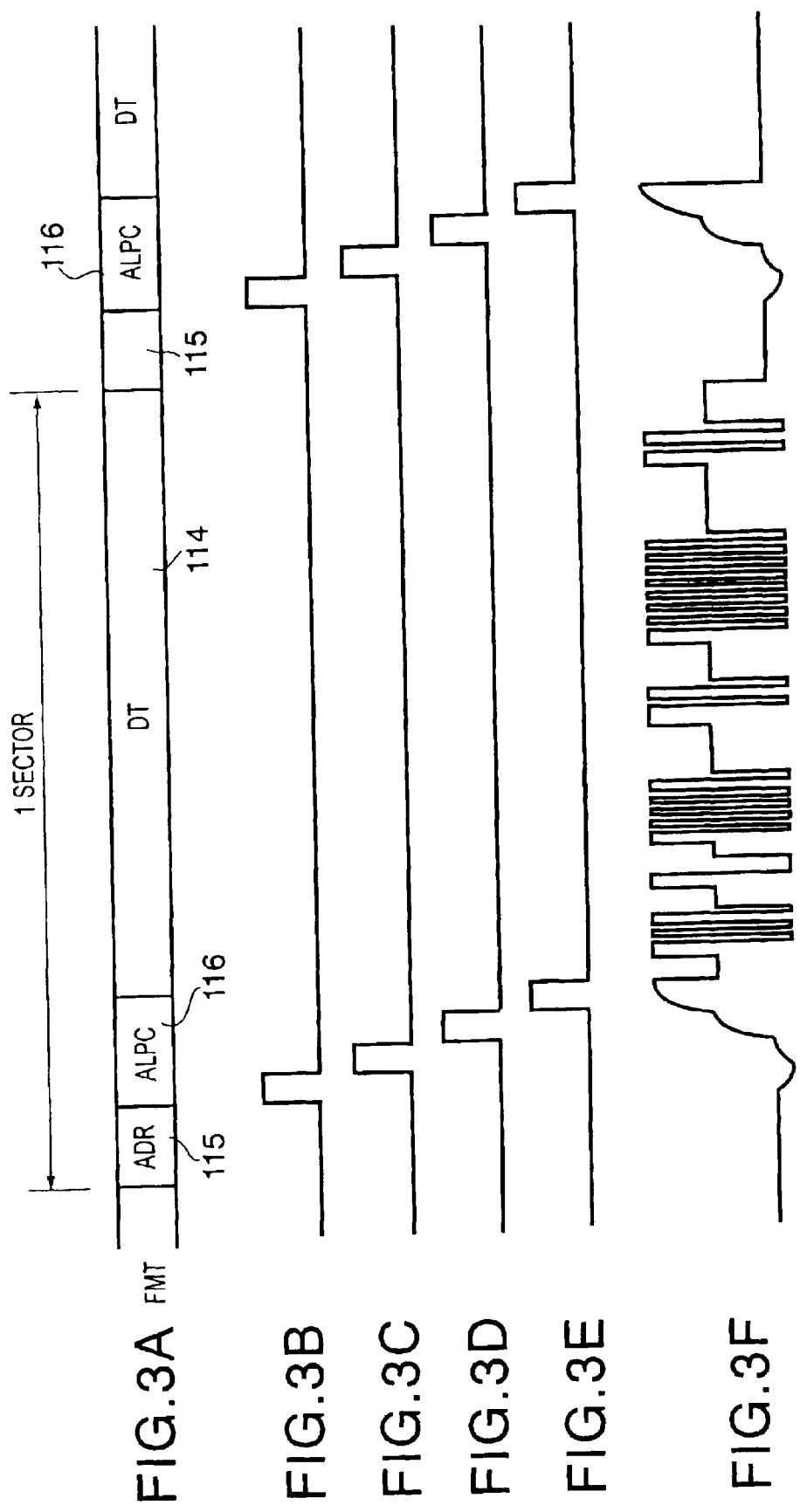
FIGS. 3A to 3F are views of the format of a magneto-optic disk and a waveform diagram including an optical output waveform set in an ALPC region.
Figure 4:
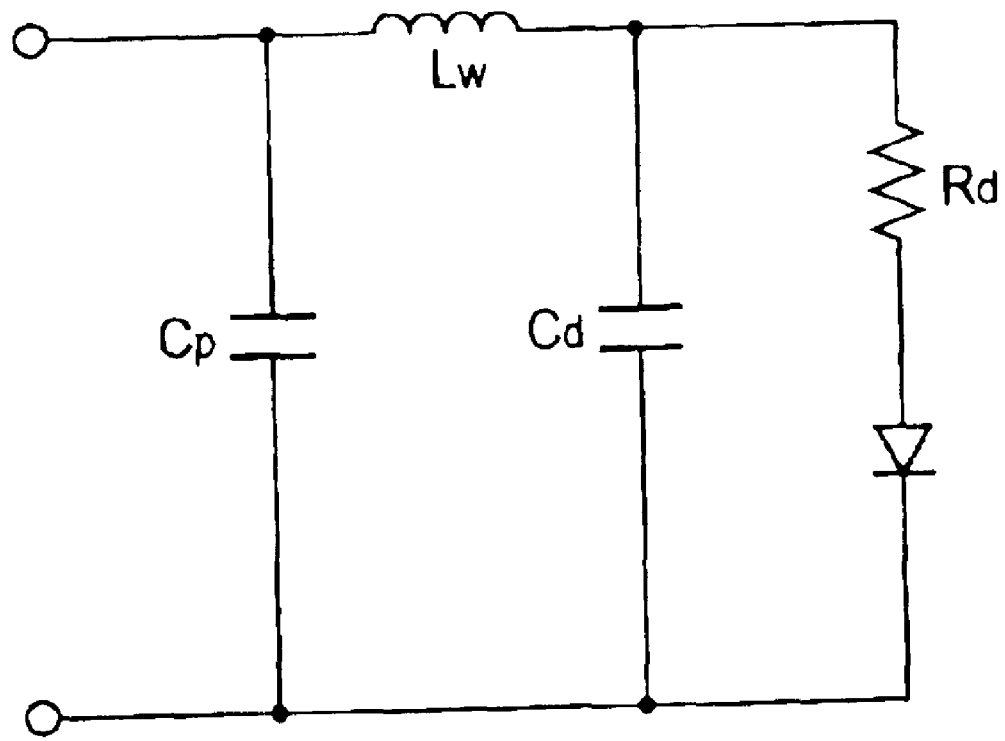
FIG. 4 is a circuit diagram of an equivalent circuit of the semiconductor laser.

Further, in for example the data portion 114 shown in FIG. 3 as well, due to a closed loop, it is possible to compare and control the laser power for each setting value.

According to the first embodiment, the pulse drive is given in the same way as at the time of recording in the power setting section as well, so there is no longer any effect on the service life of the laser due to the DC light emission of the power setting section.

Further, the laser is pulse driven in both of the power setting section and the recording section, so no difference will occur in the set laser power due to the relaxation oscillation of the laser and variation in characteristics. Further, the power is compared and controlled in the data portion as well, therefore there is the advantage that any droop characteristic of the laser which occurs can be tracked.

Second Embodiment

Figure 7:
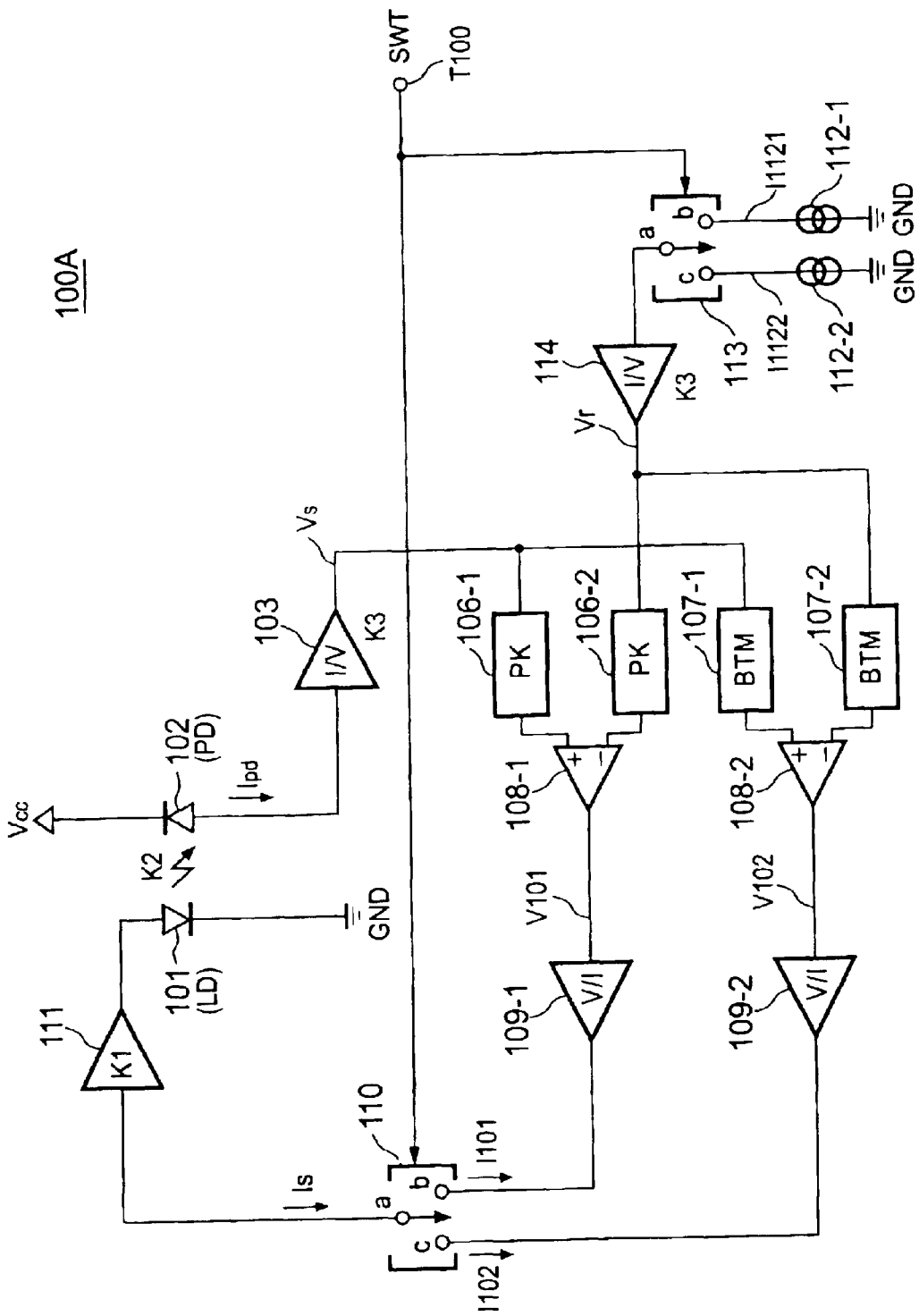
FIG. 7 is a circuit diagram of a second embodiment of a semiconductor laser optical output control circuit according to the present invention and a circuit diagram of the configuration of a semiconductor laser optical output control circuit where the setting of each optical power is given as a reference current.

FIG. 7 is a circuit diagram of a second embodiment of a semiconductor laser optical output control circuit according to the present invention.

The difference of the second embodiment from the first embodiment resides in the fact that each optical power is not set by the voltage, but is given by the reference current sources 112-1 and 112-2, these outputs are switched by the current switch 113, the output current of the current switch 113 is input to the current/voltage conversion circuit 114 having the same circuit configuration as that of the current/voltage conversion circuit 103, and this output is defined as the voltage signal Vr.

In this case, the monitor current Ipd from the PD 102 is controlled so as to become equal to the set currents I1121 and I1122.

The rest of the configuration is similar to that of the first embodiment.

According to the second embodiment, effects similar to the effects of the first embodiment mentioned above can be obtained.

Third Embodiment

Figure 8:
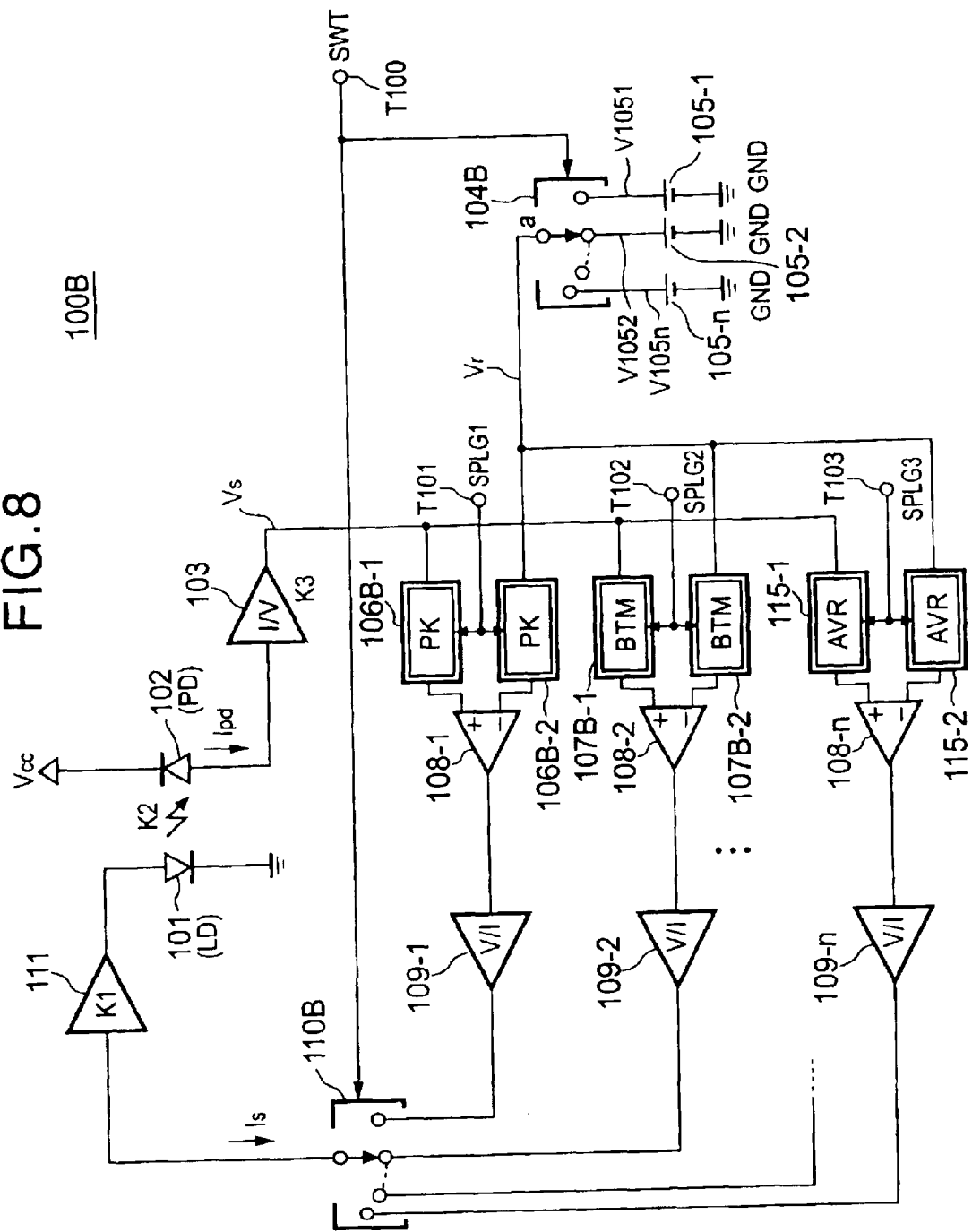
FIG. 8 is a circuit diagram of a third embodiment of a semiconductor laser optical output control circuit according to the present invention and a circuit diagram of the configuration of a semiconductor laser optical output control circuit where the optical power has three or more values.

FIG. 8 is a circuit diagram of a third embodiment of a semiconductor laser optical output control circuit according to the present invention.

The difference of the third embodiment from the first embodiment resides in the fact there are not two optical powers to be set, but multiple values of three or more values, switching circuits 104B and 110B are designed to be able to perform multivalue switching, and a mean value detection circuit (third wave detecting means) 115-1 and a mean value detection circuit (sixth wave detecting means) 115-2 are provided and further outputs of a peak value detection circuit (first wave detecting means) 106B-1, a peak value wave detection circuit (fourth wave detecting means) 106B-2, a bottom value detection circuit (second wave detecting means) 107B-1, a bottom value detection circuit (fifth wave detecting means) 107B-2, and mean value detection circuits 115-1 and 115-2 can be held.

Figure 1:
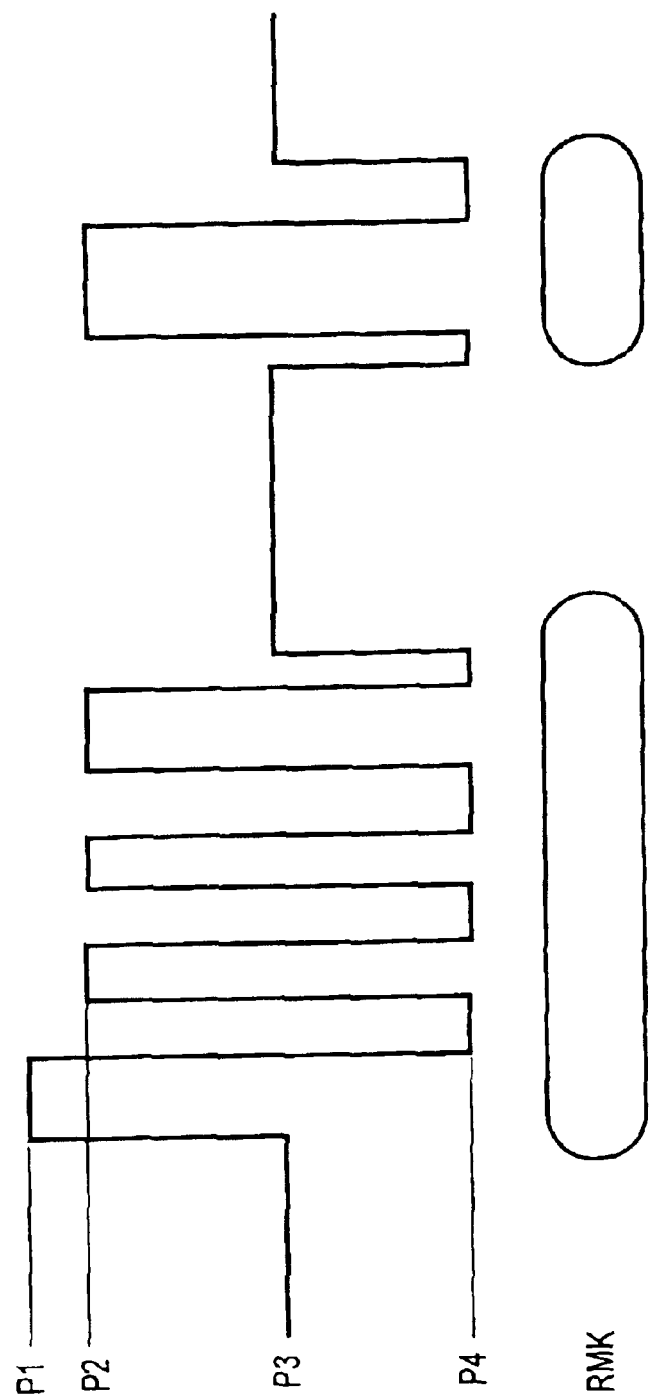
FIGS. 1A and 1B are waveform diagrams of recording light emission waveforms and DC light emissions of reproduction and erasure of a semiconductor laser.
Figure 2:
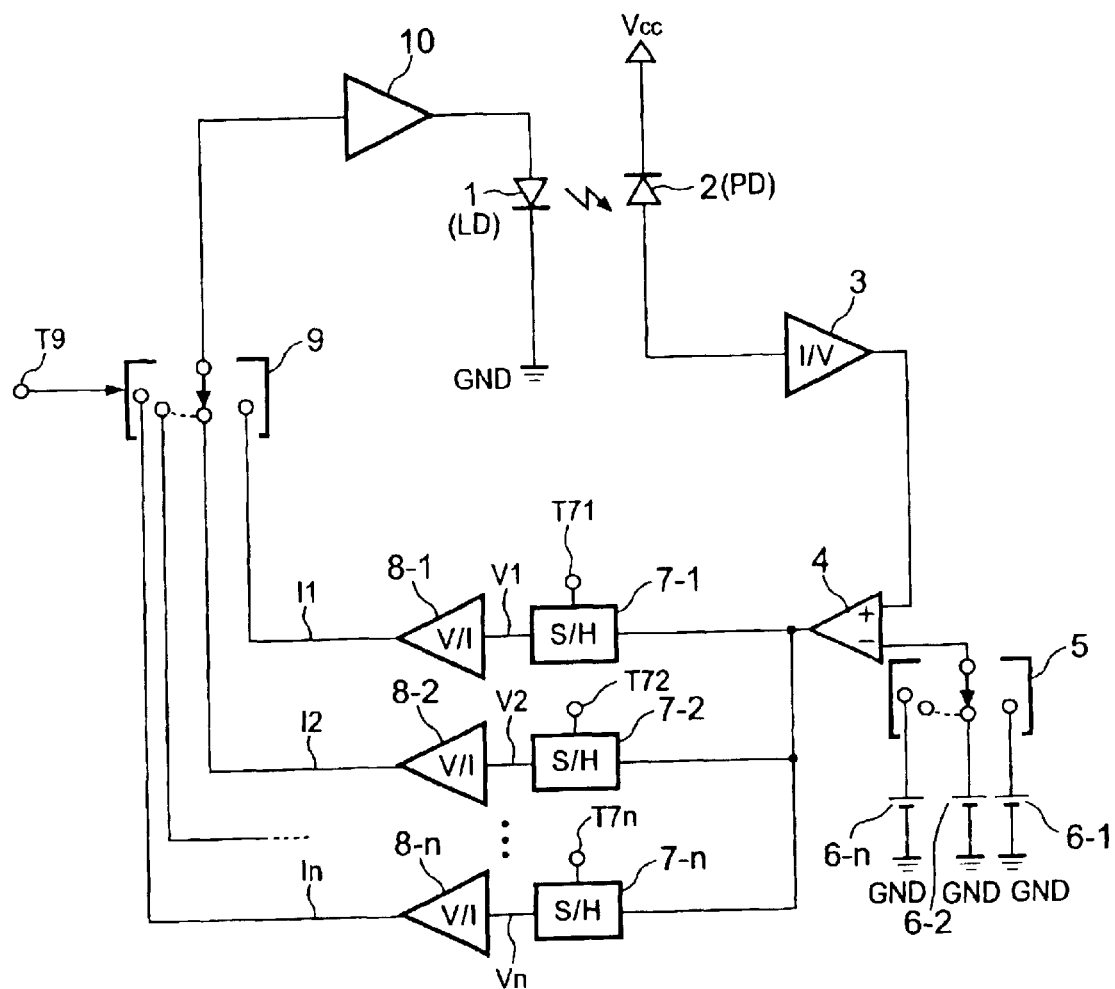
FIG. 2 is a circuit diagram of the configuration of a conventional semiconductor laser optical output control circuit.

For this reason, in the circuit of FIG. 8, in addition to the configuration of FIG. 1, provision is made of an optical power setting voltage source 105-$n$, an error amplifier 108-$n$ for comparing the outputs of the mean value detection circuits 115-1 and 115-2, and a voltage/current conversion circuit 109-$n$ for converting an output control voltage V10$n$ of the error amplifier (third comparing means) 108-$n$ to a current signal I10$n$.

The output voltage Vs of the current/voltage conversion circuit 103 is supplied to the mean value detection circuit 115-1, and the set voltage Vr of the switching circuit 104B is supplied to the mean value detection circuit 115-2.

In the third embodiment as well, the peak value detection circuits 106B-1 and 106B-2, bottom value detection circuits 107B-1 and 107B-2, and mean value detection circuits 115-1 and 115-2 have the same configurations.

Figure 9:
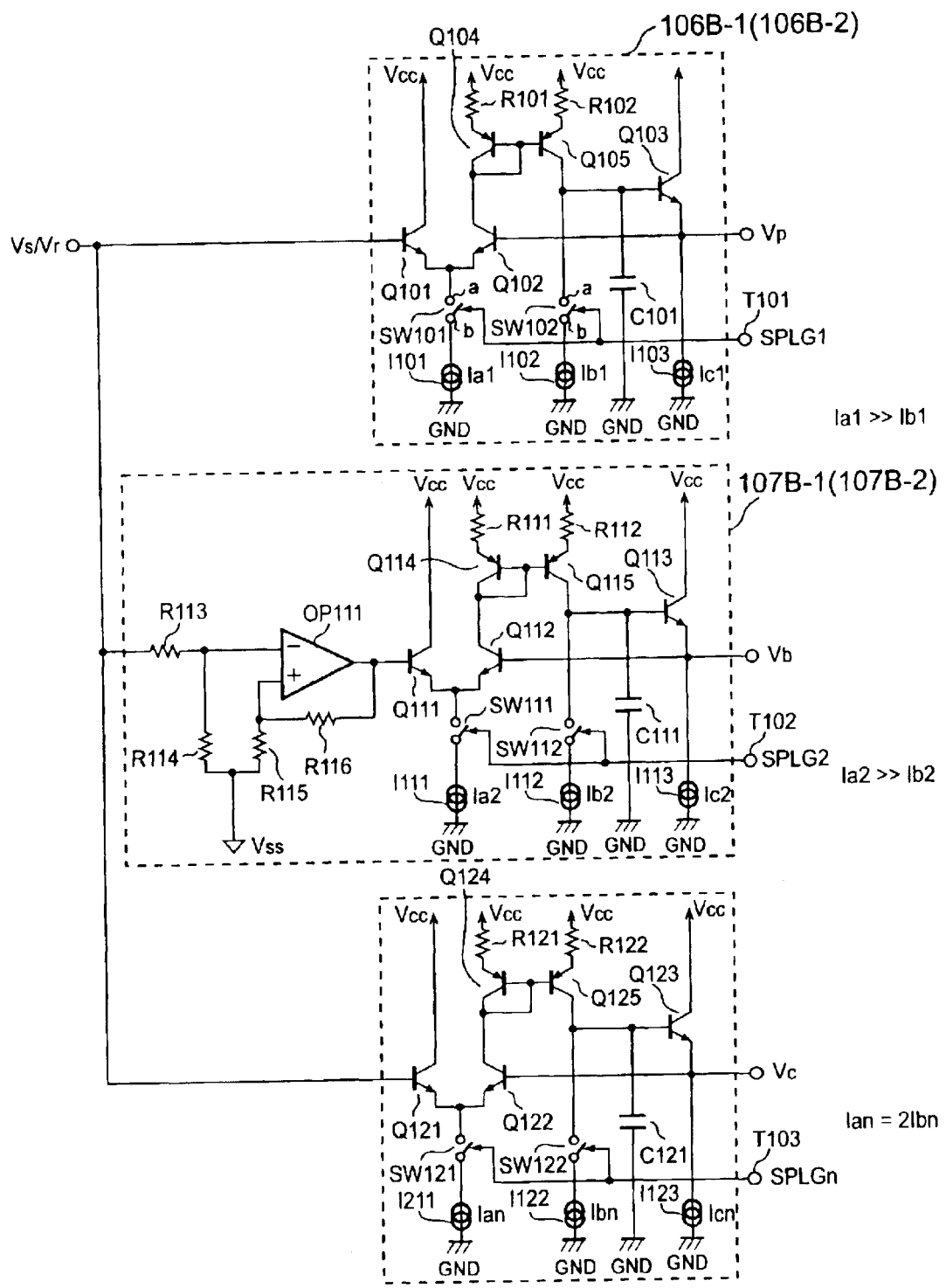
FIG. 9 is a circuit diagram of a concrete example of the configuration of a peak value detection circuit, a bottom value detection circuit, and a mean value detector.

FIG. 9 is a circuit diagram of a concrete example of the configuration of the peak value detection circuit 106B-1 (106B-2), bottom value detection circuit 107B-1 (107B-2), and mean value detection circuit 115-1 (115-2).

The peak value detection circuit 106B-1 (106B-2) has npn-type transistors Q101 to Q103, pnp-type transistors Q104 and Q105, resistance elements R101 and R102, a capacitor C101, switch circuits SW101, SW102, and current sources I101 to I103 as shown in FIG. 9.

A current value Ia1 of the current source I101 is set sufficiently larger than a current value Ib1 of the current source I102.

Emitters of the transistor Q101 and the transistor Q102 are connected to each other, this connection point is connected to the contact a of the switch circuit SW101, and the contact b of the switch circuit SW101 is connected to the current source I101.

The base of the transistor Q101 is connected to the supply line of the voltage Vs (Vr), and the collector is connected to the supply line of the power supply voltage Vcc. The base of the transistor Q102 is connected to the connection point between the emitter of the transistor Q103 of the output stage and the current source I103. Namely, the output voltage Vp is fed back to the base of the transistor Q102. The collector of the transistor Q102 is connected to the collector of the transistor Q104 and connected to the base. The emitter of the transistor Q104 is connected via the resistance element R101 to the supply line of the power supply voltage Vcc. The base of the transistor Q104 is connected to the base of the transistor Q105, and the emitter of the transistor Q105 is connected to the supply line of the power supply voltage Vcc via the resistor R102. Then, the collector of the transistor Q105 is connected to the contact a of the switch circuit SW102, the base of the transistor Q103, and the first electrode of the capacitor C101. The contact b of the switch circuit SW102 is connected to the current source I102, and the second electrode of the capacitor C101 is grounded.

The collector of the transistor Q103 is connected to the supply line of the power supply voltage Vcc, and the emitter is connected to the current source I103.

The peak value detection circuit 106B-1 (106B-2) having such a configuration is connected to the switch circuits SW101 and SW102 and detects the peak values of the switch circuits SW101 and SW102 when the sample gate signal SPLG1 input via the terminal T101 is at the 'High' level and is disconnected from the switch circuits SW101 and SW102 and holds the output values when the sample gate signal SPLG1 is at the 'Low' level.

The bottom value detection circuit 107B-1 (107B-2) has, as shown in FIG. 9, npn-type transistors Q111 to Q113, pnp-type transistors Q114 and Q115, resistance elements R111 to R116, a capacitor C111, switch circuits SW111 and SW112, current sources I111 to I113, and an operational amplifier OP111 for level inversion.

A current value Ia2 of the current source I111 is set sufficiently larger than a current value Ib2 of the current source I112.

The emitters of the transistor Q111 and the transistor Q112 are connected to each other, this connection point is connected to the contact a of the switch circuit SW111, and the contact b of the switch circuit SW111 is connected to the current source I111.

The base of the transistor Q111 is connected to the output of the operational amplifier OP111 and connected to the noninverted input (+) of the operational amplifier OP111 via the resistance element R116, and the noninverted input (+) of the operational amplifier OP111 is connected via the resistance element R115 to the reference voltage source Vss. The inverted input (−) of the operational amplifier OP111 is connected via the resistance element R113 to the supply line of the voltage Vs (Vr), while the inverted input (−) of the operation amplifier OP111 is connected via the resistance element R114 to the reference voltage source Vss.

The collector of the transistor Q111 is connected to the supply line of the power supply voltage Vcc. The base of the transistor Q112 is connected to the connection point of the emitter of the transistor Q113 of the output stage and the current source I113. Namely, the output voltage Vb is fed back to the base of the transistor Q112. The collector of the transistor Q112 is connected to the collector of the transistor Q114 and connected to the base. The emitter of the transistor Q114 is connected via the resistance element R111 to the supply line of the power supply voltage Vcc. The base of the transistor Q114 is connected to the base of the transistor Q115, while the emitter of the transistor Q115 is connected to the supply line of the power supply voltage Vcc via the resistance element R112. Then, the collector of the transistor Q115 is connected to the contact a of the switch circuit SW112, the base of the transistor Q113, and the first electrode of the capacitor C111. The contact b of the switch circuit SW112 is connected to the current source I112, and the second electrode of the capacitor C111 is grounded.

The collector of the transistor Q113 is connected to the supply line of the power supply voltage Vcc, while the emitter is connected to the current source I113.

The bottom value detection circuit 107B-1 (107B-2) having such a configuration is connected with the switch circuits SW111 and SW112 and detects the peak values of the switch circuits SW111 and SW112 when the sample gate signal SPLG2 input via the terminal T102 is at the 'High' level and is disconnected from the switch circuits SW111 and SW112 and holds the output values when the sample gate signal SPLG2 is at the 'Low' level.

The mean value detection circuit 115-1 (115-2) has, as shown in FIG. 9, npn-type transistors Q121 to Q123, pnp-type transistors Q124 and Q125, resistance elements R121 and R122, a capacitor C121, switch circuits SW121 and SW122, and current sources I121 to I123.

A current value Ian of the current source I121 is set to twice of a current value Ibn of the current source I122.

The emitters of the transistor Q121 and the transistor Q122 are connected to each other, this connection point is connected to the contact a of the switch circuit SW121, and the contact b of the switch circuit SW121 is connected to the current source I121.

The base of the transistor Q121 is connected to the supply line of the voltage Vs (Vr), and the collector is connected to the supply line of the power supply voltage Vcc. The base of the transistor Q122 is connected to the connection point of the emitter of the transistor Q123 and the connection point of the current source I123. Namely, the output voltage Vc is fed back to the base of the transistor Q122. The collector of the transistor Q122 is connected to the collector of the transistor Q124 and connected to the base. The emitter of the transistor Q124 is connected to the supply line of the power supply voltage Vcc via the resistance element R121. The base of the transistor Q124 is connected to the base of the transistor Q125, while the emitter of the transistor Q125 is connected to the supply line of the power supply voltage Vcc via the resistance element R122. Then, the collector of the transistor Q125 is connected to the contact a of the switch circuit SW122, the base of the transistor Q123, and the first electrode of the capacitor C121. The contact b of the switch circuit SW122 is connected to the current source I122, and the second electrode of the capacitor C121 is grounded.

Then, the collector of the transistor Q123 is connected to the supply line of the power supply voltage Vcc, while the emitter is connected to the current source I123.

The mean value detection circuit 115-1 (115-2) having such a configuration is connected to the switch circuits SW121 and SW122 and detects the peak values of the switch circuits SW121 and SW122 when the sample gate signal SPLGn input via the terminal T103 is at the 'High' level and is disconnected from the switch circuits SW121 and SW122 and holds the output values when the sample gate signal SPLGn is at the 'Low' level.

Note that, in the case of two-value control, as in the first embodiment, only the peak value detection circuit and the bottom value detection circuit are sufficient. The input of the sample gate signal is not necessary. Also, in three-value control, only the mean value detection circuit input becomes necessary as the input of the sample gate signal. The peak value detection circuit and the bottom value detection circuit are not basically needed. In four-value or higher control, it is necessary to gate each detection section.

In this example of a circuit, the mean value detection is used, envisioning setting the erasing power in an optical disk capable of overwrite, corresponding to the level of P3 of FIG. 1A, by the portions forming spaces between recording marks.

This does not always have to be mean value detection. A circuit for detecting a predetermined level (intermediate value) between the peak and the bottom or a peak value detection circuit and bottom value detection circuit can be employed.

In this erasing section as well, however, in the case of general high frequency superimposition at the time of reproduction, it must be mean value detection.

FIGS. 10A to 10I are views of the state of a pull-in operation for three power settings in the circuit configuration of FIG. 8 as an example of multivalue control using sample gate signals for detection circuits of the peak value detection circuits 106B-1 and 106B-2, bottom value detection circuits 107B-1 and 107B-2, and mean value detection circuits 115-1 and 115-2.

Figure 10:
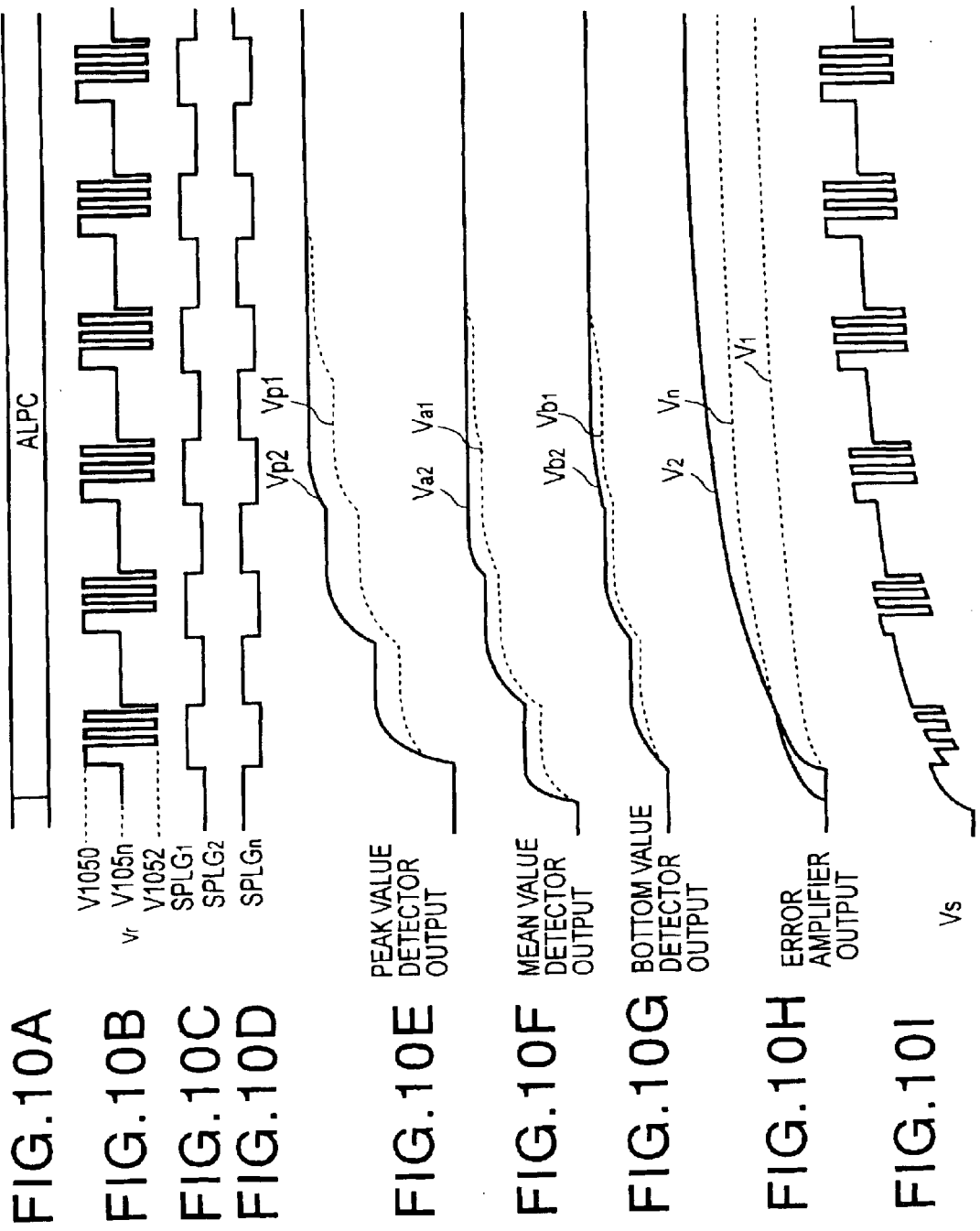
FIGS. 10A to 10I are waveform diagrams of the state of a pull-in operation of three power settings in a semiconductor laser optical output control circuit of multivalue control using sample gate signals for detectors according to a third embodiment.

In this example, the pull-in operation of each power setting is simultaneously carried out by repeated data of marks/spaces of equal width in the ALPC portion shown in FIG. 10A. For the sample gate signals SPLG1 and SPLG2 of the peak value detection circuits 106B-1 and 106B-2 and the bottom value detection circuits 107B-1 and 107B-2 shown in FIG. 10B, the mark signals for recording are input, while for the sample gate signal SPLGn of the mean value detection circuits 115-1 and 115-2 shown in FIG. 10C, the space signals are input.

The comparison and control are similarly performed in data portion comprised of random data, but for the fluctuations of the peak value detection circuits 106B-1 and 106B-2 due to the mark lengths, since the Vp1 and Vp2 of the input of the error amplifier 108-1 move in synchronization, the control voltage V101 of the output thereof does not fluctuate. The fluctuation of the mark length of the bottom value detection circuits 107B-1 and 107B-2 is similar. Note that, the mean value detection is not affected by the mark length.

Figure 11:
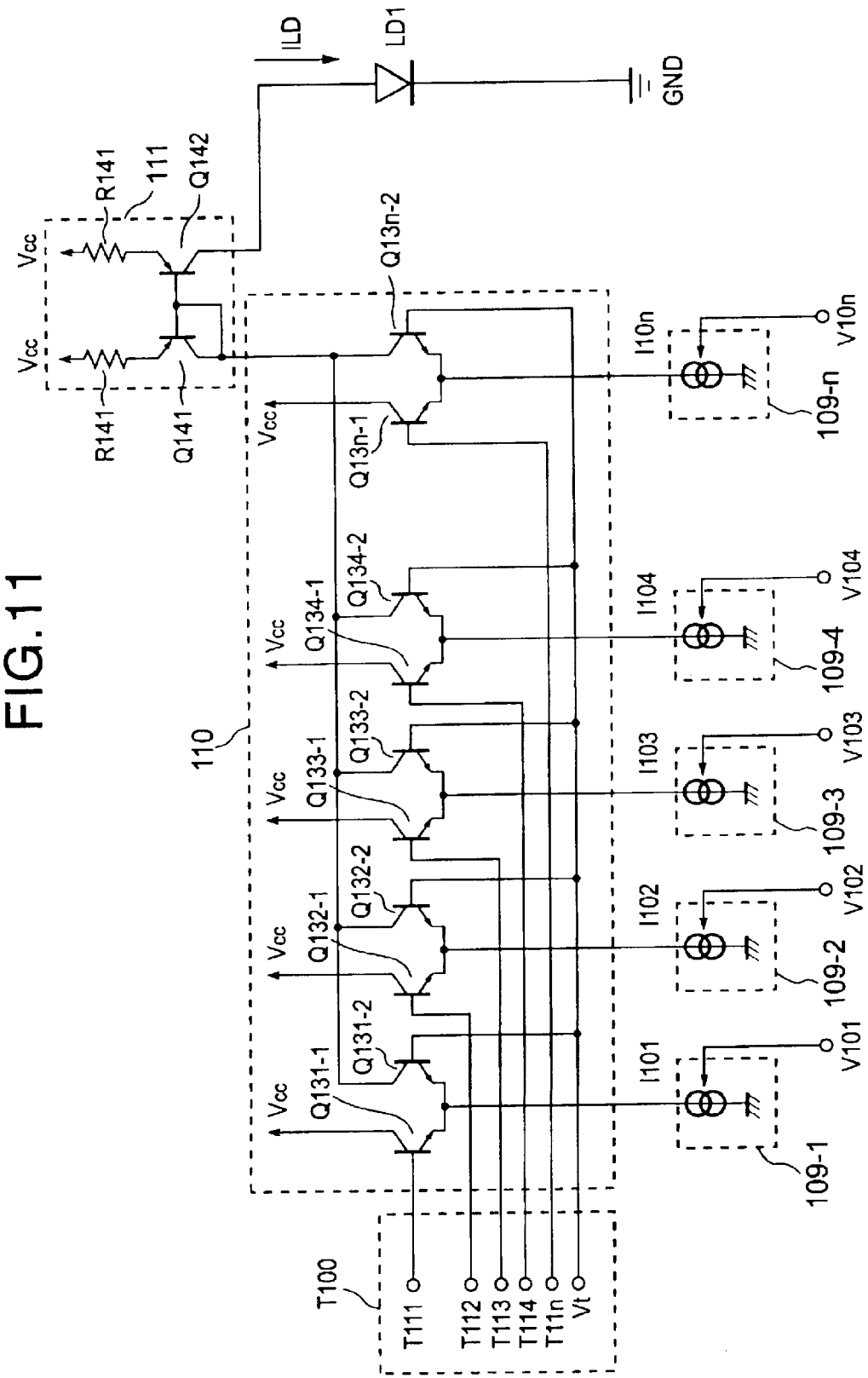
FIG. 11 is a circuit diagram of a concrete example of a voltage/current control circuit, a switching circuit, and a current amplifier according to the third embodiment.
Figure 12:
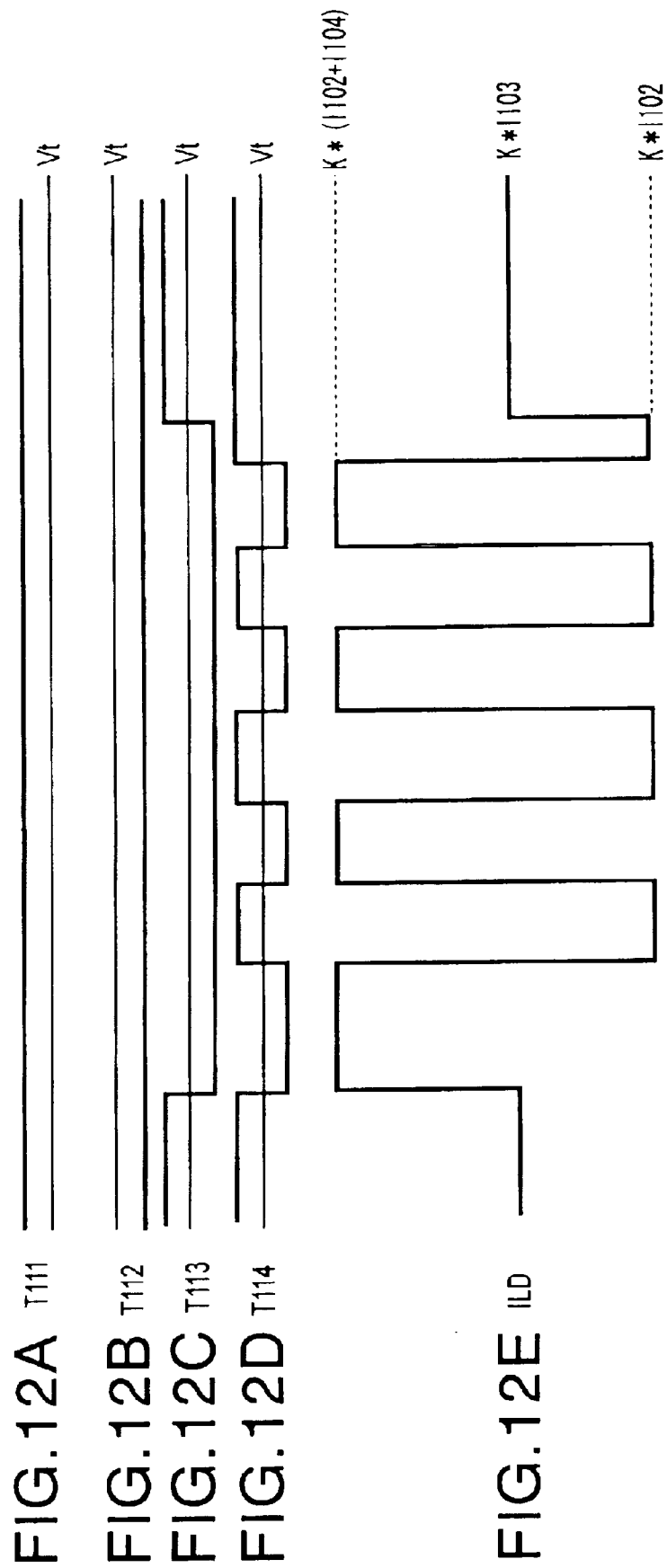
FIGS. 12A to 12E are waveform diagrams of a concrete example of recording light emission waveforms and DC light emissions of reproduction and erasure according to the circuit of FIG. 11.

FIG. 11 is a circuit diagram of a concrete example of the voltage/current control circuits 109-1, 109-2, ..., 109-n, the switching circuit 110, and the current amplifier 111. Further, FIGS. 12A to 12E are waveform diagrams of a concrete example of the recording light emission waveform and DC light emission of reproduction and erasure according to the circuit of FIG. 11.

The switching circuit 110 is emitter-coupled as shown in FIG. 11 and has npn-type transistors Q131-1 and Q131-2, Q132-1 and Q132-2, Q133-1 and Q133-2, Q134-1 and Q134-2, ..., Q13n-1 and Q13n-2 wherein the connection points of the emitters are connected to the current outputs of the voltage/current control circuits 109-1, 109-2, ..., 109-n.

The base of the transistor Q131-1 is connected to the supply line of the timing signal T111, the base of the transistor Q132-1 is connected to the supply line of the timing signal T112, the base of the transistor Q133-1 is connected to the supply line of the timing signal T133, the base of the transistor Q134-1 is connected to the supply line of the timing signal T114, and the base of the transistor Q13n-1 is connected to the supply line of the timing signal T11n.

Bases of the transistors Q131-2, Q132-2, Q133-2, Q134-2, and Q13n-2 are connected to the supply terminal of the control voltage Vt.

Then, collectors of the transistors Q131-2, Q132-2, Q133-2, Q134-2, and Q13n-2 are commonly connected to the input end of the current amplifier 111.

Also, the current amplifier 111 has pnp-type transistors Q141 and Q142 and resistance elements R141 and R142.

The collector and base of the transistor Q141 are connected to the collectors of the transistors Q131-2, Q132-2, Q133-2, Q134-2, and Q13n-2 of the switching circuit 110. The emitter of the transistor Q141 is connected via the resistance element R141 to the supply line of the power supply voltage Vcc, and the base is connected to the base of the transistor Q142. The emitter of the transistor Q142 is connected via the resistance element R141 to the supply line of the power supply voltage Vcc, and the collector is connected to an anode of the LD 1.

Namely, the current amplifier 111 is configured by a current mirror circuit.

The circuit of FIG. 11 generates currents I101, I102, I103, I104, ..., I10n in the voltage/current control circuits 109-1, 109-2, ..., 109-n, switches them by the switching circuit 110 at timings of timing signals T111, T112, T113, T114, ..., T11n as shown in FIG. 11 and FIGS. 12A to 12E, and further multiplies them by K by the current amplifier 111 to drive the LD 1.

At the time of driving this LD1, the APC circuit has become a closed loop, so it is possible to easily generate a high speed pulse drive current ILD of the recording mode.

According to the third embodiment, even in the case where the optical power to be set is not two values, but a multiple value of three values or more, similar effects to the effects of the above first embodiment mentioned above can be obtained.

Namely, similarly in setting multiple values of power as well, the laser can be pulse driven in the same way as that at the time of recording in the power setting section, therefore the influence upon the service life of the laser due to the DC light emission of the power setting section disappears.

Further, since the laser is pulse driven in both of the power setting section and the recording section, no difference will occur in the set laser power due to the relaxation oscillation and variations in characteristics of the laser. Further, even after the pull-in operation of the power setting ends in the ALPC portion 116, the comparison and control are performed in the data portion 114 as well, so any droop characteristic of the laser which occurs can be tracked.

Also, it is not necessary to sequentially pull-in each laser power setting in time series at the ALPC portion 116 as shown in FIGS. 3A to 3F, and operations can be simultaneously carried out, therefore it becomes advantageous in setting multiple values of power in the limited ALPC portion.

Fourth Embodiment

Figure 13:
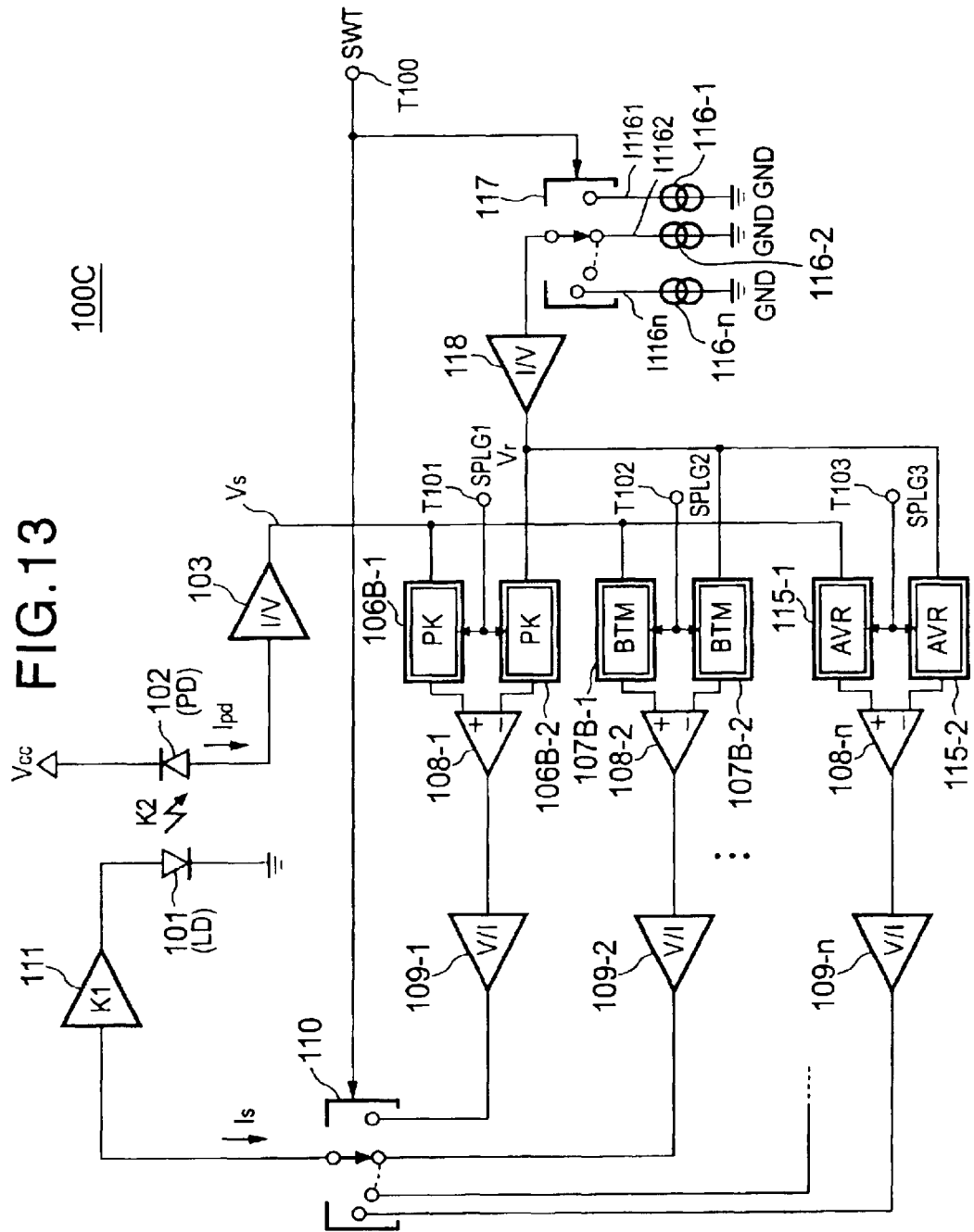
FIG. 13 is a circuit diagram of a fourth embodiment of a semiconductor laser optical output control circuit according to the present invention.

FIG. 13 is a circuit diagram of a fourth embodiment of a semiconductor laser optical output control circuit according to the present invention.

The difference of the fourth embodiment from the third embodiment resides in that each optical power is not set by voltage, but is given by the reference current sources 116-1, 116-2, . . . , 116-n, these outputs are switched by the current switch 117, the output current of the current switch 117 is input to the current/voltage conversion circuit 118 having the same circuit configuration as that of the current/voltage conversion circuit 103, and this output is defined as the voltage signal Vr.

In this case, the monitor current Ipd from the PD 102 is controlled so as to become equal to the set currents I1161, I1162, . . . , I116n.

The rest of the configuration is similar to that of the third embodiment.

According to the fourth embodiment, similar effects to the effects of the third embodiment mentioned above can be obtained.

Namely, similarly in setting multiple values of power, the laser is pulse driven in the same way as the time of recording in the power setting section as well, so the influence upon the service life of the laser due to the DC light emission of the power setting section disappears.

Further, since the laser is pulse driven in both of the power setting section and the recording section, no difference will occur in the set laser power due to the relaxation oscillation and variation in characteristics of the laser. Further, even after the pull-in operation of the power setting ends in the ALPC portion 116, the comparison and control are performed in the data portion 114 as well, so any droop characteristic of the laser which occurs can be tracked.

Also, it is not necessary to sequentially pull-in each laser power setting in time series at the ALPC portion 116 as shown in FIGS. 3A to 3F, and operations can be simultaneously carried out, therefore it becomes advantageous in setting multiple values of power in the limited ALPC portion.

Fifth Embodiment

Figure 14:
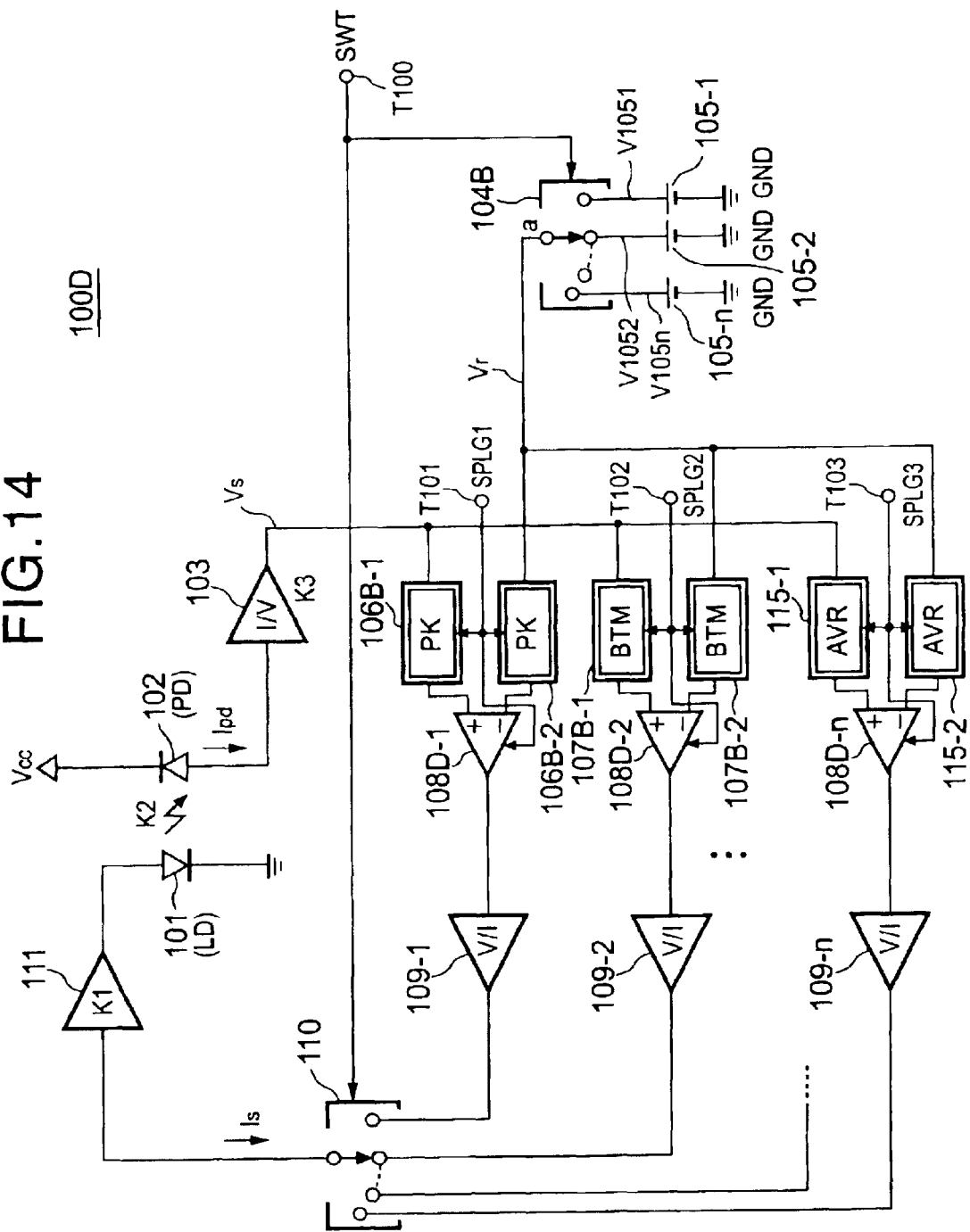
FIG. 14 is a circuit diagram of a fifth embodiment of a semiconductor laser optical output control circuit according to the present invention.

FIG. 14 is a circuit diagram of a fifth embodiment of a semiconductor laser optical output control circuit according to the present invention.

The difference of the fifth embodiment from the third embodiment resides in that the sample gate signals SPLG1, SPLG2, and SPLG3 are input to not only the peak value detection circuits 106B-1 and 106B-2, the bottom value detection circuits 107B-1 and 107B-2, and the mean value detection circuits 115-1 and 115-2, but also the error amplifiers 108D-1, 108D-2 and 108D-n of the output stages of these detection circuits.

The rest of the configuration is similar to that of the third embodiment.

According to the fifth embodiment, there are advantages that effects similar to the effects of the third embodiment mentioned above can be obtained of course, but also erroneous processing at a data waiting time etc. can be prevented.

Sixth Embodiment

Figure 15:
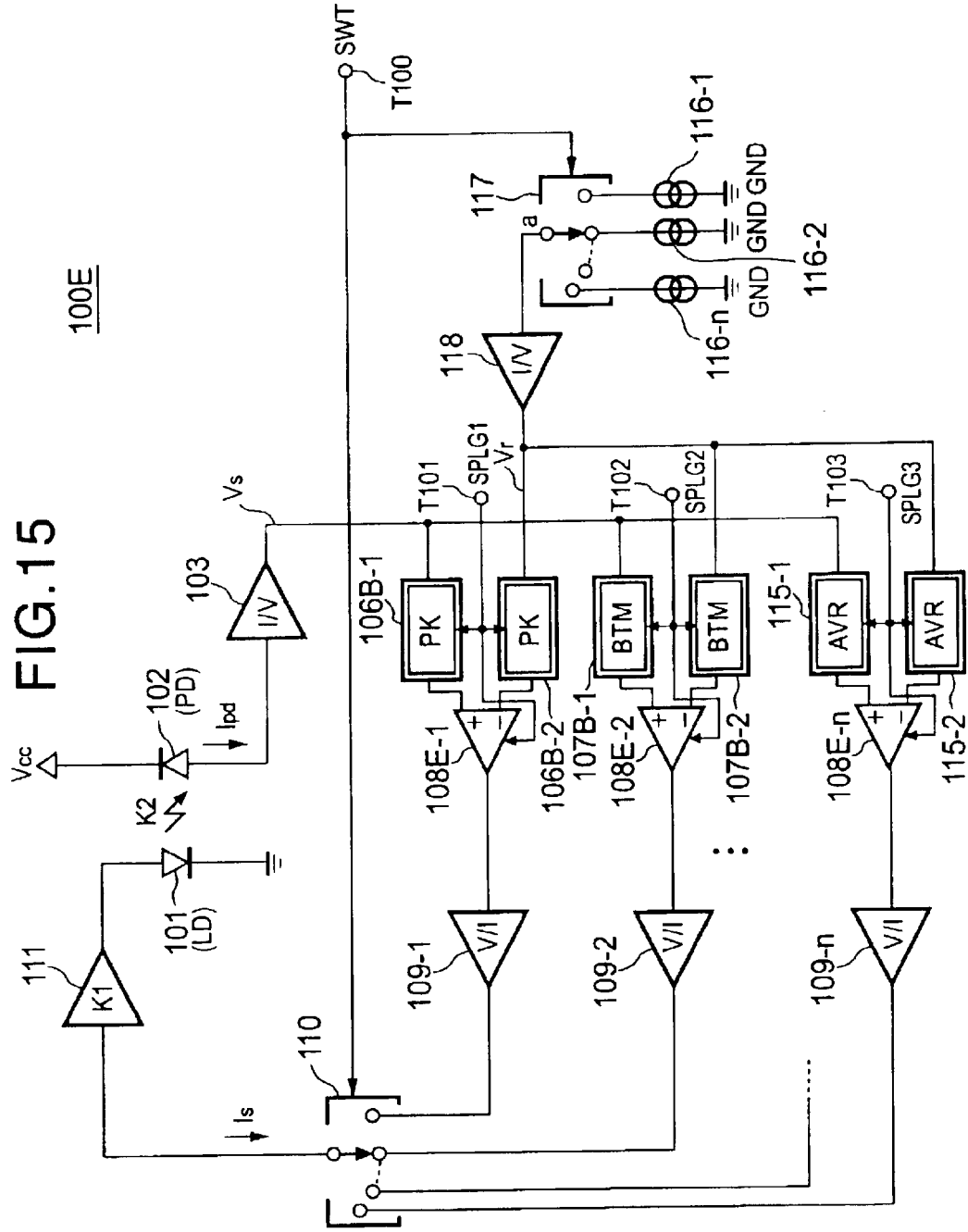
FIG. 15 is a circuit diagram of a sixth embodiment of a semiconductor laser optical output control circuit according to the present invention.

FIG. 15 is a circuit diagram of a sixth embodiment of the semiconductor laser optical output control circuit according to the present invention.

The difference of the sixth embodiment from the fourth embodiment resides in that the sample gate signals SPLG1, SPLG2, and SPLG3 are input to not only the peak value detection circuits 106B-1 and 106B-2, the bottom value detection circuits 107B-1 and 107B-2, and the mean value detection circuits 115-1 and 115-2, but also the error amplifiers 108E-1, 108E-2 and 108E-n of the output stages of these detection circuits.

The rest of the configuration is similar to that of the fourth embodiment.

According to the sixth embodiment, effects similar to the effects of the fourth embodiment mentioned above can be obtained.

Seventh Embodiment

Figure 16:
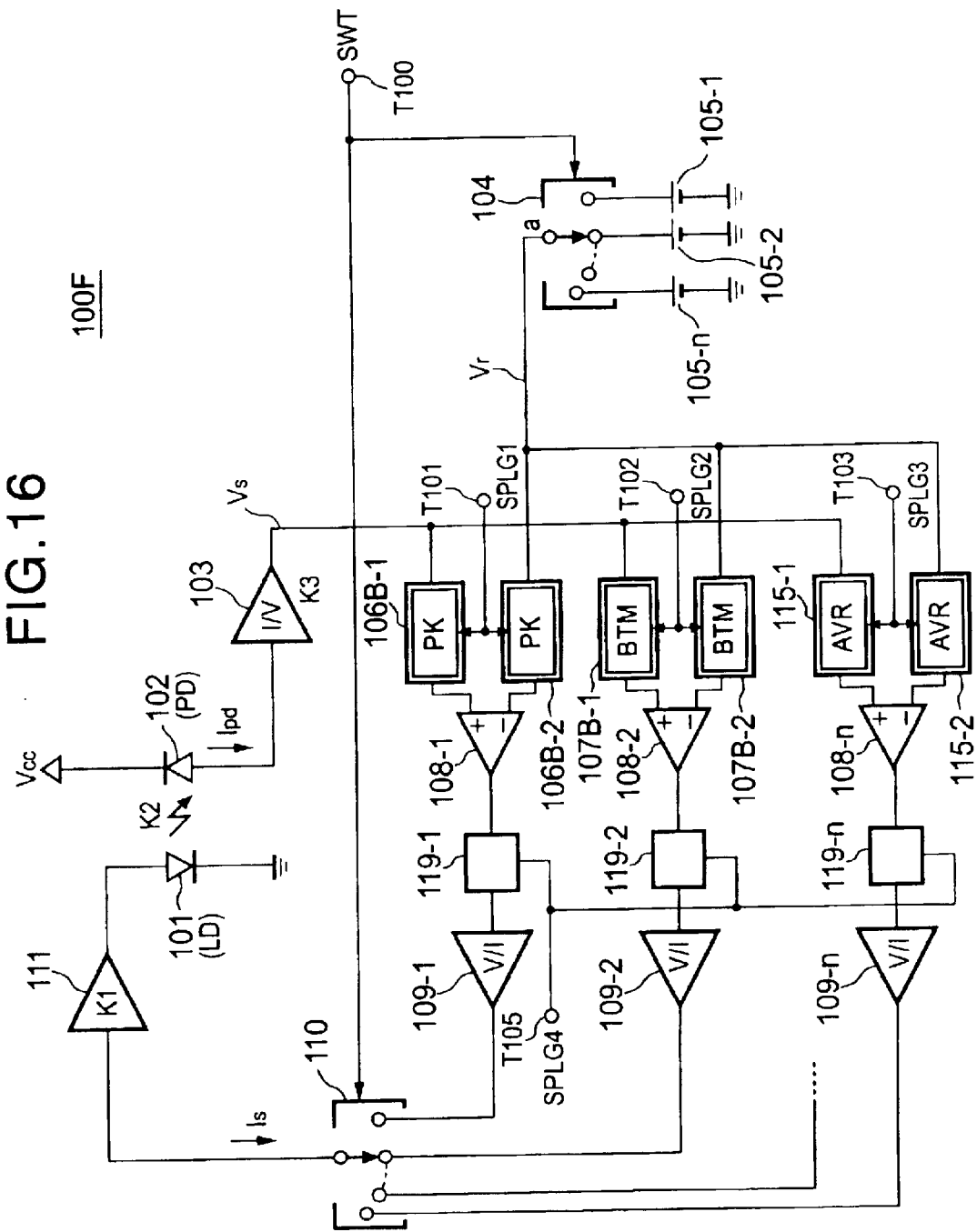
FIG. 16 is a circuit diagram of a seventh embodiment of a semiconductor laser optical output control circuit according to the present invention.

FIG. 16 is a circuit diagram of a seventh embodiment of a semiconductor laser optical output control circuit according to the present invention.

The difference of the seventh embodiment from the third embodiment resides in that sample/hold circuits 119-1, 119-2, . . . , 119-n are arranged between the outputs of the error amplifiers 108-1, 108-2, . . . , 108-n and the voltage/current conversion circuits 109-1, 109-2, . . . , 109-n.

The embodiment is configured in this way for the following reason.

According to the format of the optical disk, the ALPC portion 116 is not provided in each sector as shown in FIGS. 3A to 3F. The laser power is set in regions other than the user area such as test zones or manufacture zones provided at the inner and outer circumferences of the disk.

In this case, as shown in FIG. 16, in addition to the configuration of FIG. 8, by adding the sample/hold circuits 119-1, 119-2, . . . , 119-n for holding control voltages of error amplifier outputs, realization becomes possible without losing the effects of the present invention.

That is, the sample gate signals SPLG4 of the sample/hold circuits 119-1, 119-2, . . . , 119-n are brought to the 'High' level to perform the pull-in operation of each power setting in the region of test zone or manufacture zone for performing the laser power set up. During the seek operation to the user area, this sample gate signal SPLG4 is made the 'Low' level, and the control voltage of each light emission power is held. In the data portion of the sector to be recorded, the sample gate signal SPLG4 is made the 'High' level again, and comparison and control are performed using the held control voltage as the initial value.

The rest of the configuration is similar to that of the third embodiment.

According to the seventh embodiment, similar effects to the effects of the third embodiment mentioned above can be obtained.

Namely, similarly in setting multiple values of power, the laser is pulse driven in the same way as the time of recording in the power setting section as well, so the influence upon the service life of the laser due to the DC light emission of the power setting section disappears.

Further, since the laser is pulse driven in both of the power setting section and the recording section, no difference will occur in the set laser power due to the relaxation oscillation and variation in characteristics of the laser. Further, even after the pull-in operation of the power setting ends in the ALPC portion 116, the comparison and control are performed in the data portion 114 as well, so any droop characteristic of the laser which occurs can be tracked.

Also, it is not necessary to sequentially pull-in each laser power setting in time series at the ALPC portion 116 as shown in FIGS. 3A to 3F, and operations can be simultaneously carried out, therefore it becomes advantageous in setting multiple values of power in the limited ALPC portion.

Note that of course this configuration can be applied not only to multiple values, but also a two-value circuit like the circuits of FIG. 5 and FIG. 7.

Eighth Embodiment

Figure 17:
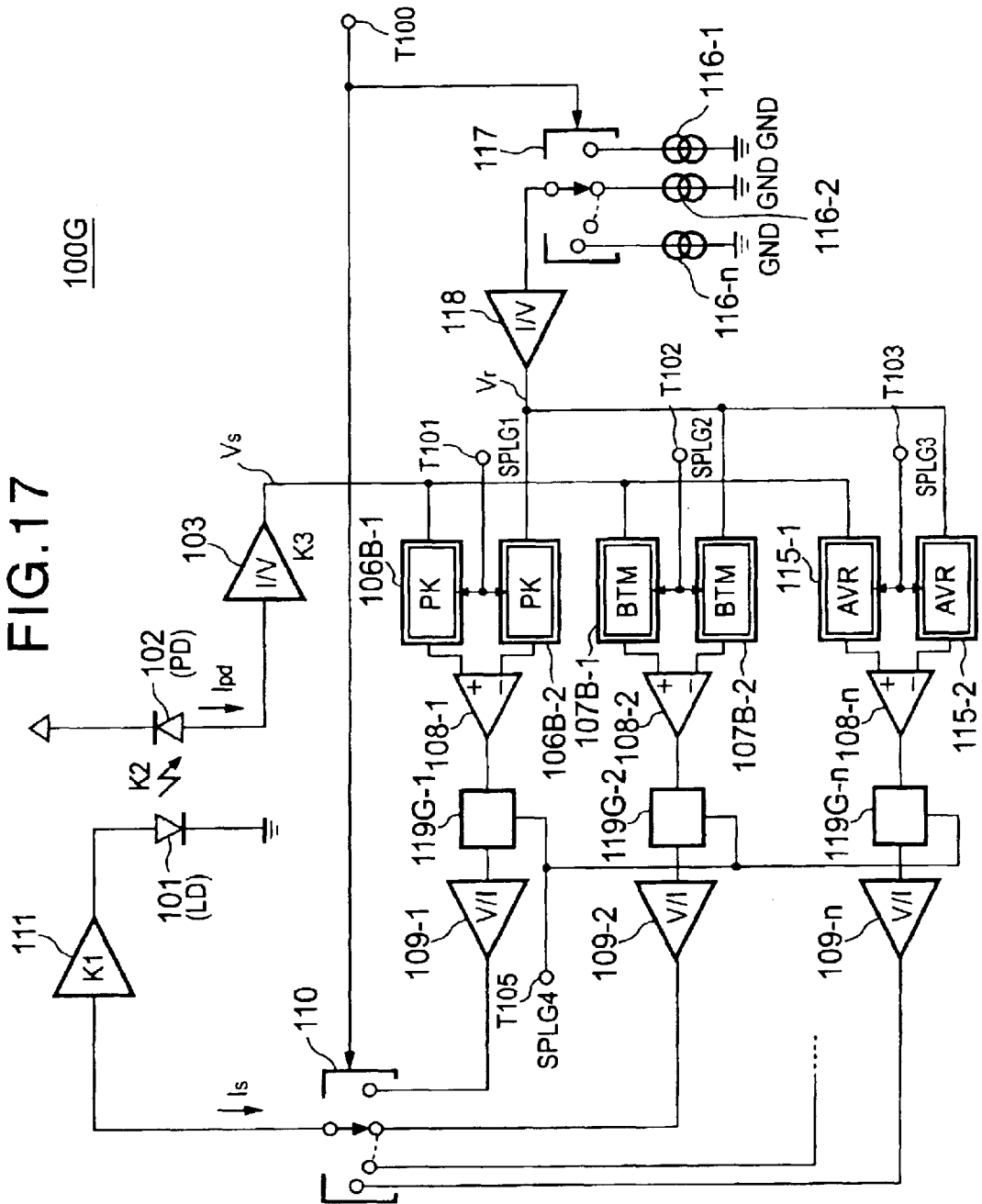
FIG. 17 is a circuit diagram of an eighth embodiment of a semiconductor laser optical output control circuit according to the present invention.

FIG. 17 is a circuit diagram of an eighth embodiment of a semiconductor laser optical output control circuit according to the present invention.

The difference of the eighth embodiment from the fourth embodiment resides in that sample/hold circuits 119G-1, 119G-2, . . . , 119G-n are arranged between the outputs of the error amplifiers 108-1, 108-2, . . . , 108-n and the voltage/current conversion circuits 109-1, 109-2, . . . , 109-n for a similar reason to that for the seventh embodiment.

The rest of the configuration is similar to that of the fourth embodiment.

The eighth embodiment, in the same way as the seventh embodiment, can be applied to disks not provided with the ALPC portion 116 in each sector, but setting the laser power in regions other than the user area such as test zones or manufacture zones provided at the inner and outer circumferences of the disk.

Ninth Embodiment

Figure 18:
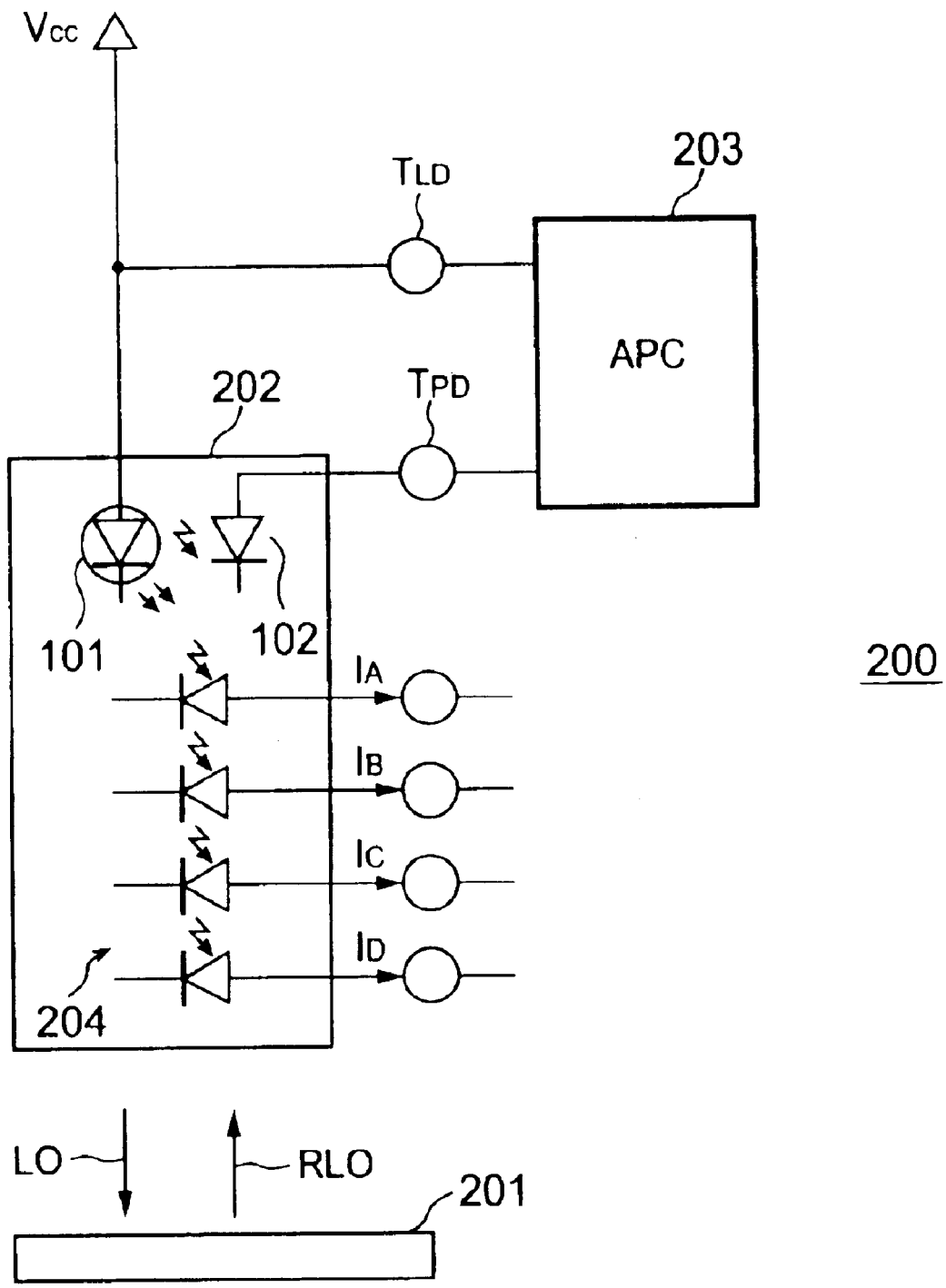
FIG. 18 is a circuit diagram of a principal part of an optical disk device employing a semiconductor laser optical output control circuit according to the present invention.

FIG. 18 is a circuit diagram of a principal part of a optical disk device employing a semiconductor laser optical output control circuit according to the present invention.

In FIG. 18, in an optical disk device 200, 201 indicates an optical disk medium, 202 indicates an optical pick-up, and 203 indicates an APC circuit.

The optical pick-up 202 is provided with a laser diode LD 101 for emitting a laser beam LO toward the optical disk medium 201 in accordance with the value of the drive current ILD, the monitor use PD 102 receiving the laser beam LO emitted from the LD 101 and generating a monitor current Ipd in accordance with the light reception level, and a photo-detector 204 for receiving the reflected return light of the laser beam emitted to the optical disk medium 201 and generating a current of a value in accordance with the light reception level as the principal components.

Here, as the LD 101, the PD 102, and the APC circuit 203 provided in the optical pick-up 202, circuits and elements are applied to the semiconductor laser optical output control circuits 100 to 100G according to the above first to eighth embodiments.

Accordingly, according to the optical disk device 200, the laser can be pulse driven in the same way as the time of recording in the power setting section as well, therefore the influence upon the service life of the laser due to the DC light emission of the power setting section disappears.

Further, since the laser is pulse driven in both of the power setting section and the recording section, no difference will occur in the set laser power due to the relaxation oscillation and variations in characteristics of the laser. Further, even after the pull-in operation of the power setting ends in the ALPC portion 116, the comparison and control are performed in the data portion 114 as well, so any droop characteristic of the laser which occurs can be tracked.

Also, similar effects to those of the above embodiments such that it is not necessary to sequentially pull-in each laser power setting in time series at the ALPC portion 116 as shown in FIGS. 3A to 3F and that operations can be simultaneously carried out, so which becomes advantageous in setting multiple values of power in the limited ALPC portion can be obtained.

INDUSTRIAL APPLICABILITY

As described above, according to the semiconductor laser optical output control circuit according to the present invention, pulse drive of the semiconductor laser at the time of recording and further pulse drive at the time of setting power are realized, and the optical output of the semiconductor laser pulse driven by a plurality of settings can be controlled with a high precision; therefore, the circuit can be utilized as light sources of optical disk devices, optical communication apparatuses, laser printers, and other optical devices.

What is claimed is:

1. A semiconductor laser optical output control circuit for controlling an optical output of a semiconductor laser to a desired intensity in accordance with a supplied drive current, comprising:

an optical output detecting means for detecting the optical output of said semiconductor laser;

a first detecting means for detecting a first level of said optical output detected by said optical output detecting means;

a second detecting means for detecting a second level of said optical output detected by said optical output detecting means;

a first optical output setting means for giving a first setting value of a first level in the optical output of said semiconductor laser;

a second optical output setting means for giving a second setting value of a second level in the optical output of said semiconductor laser;

a first switching means for switching and first and second setting value signals of said optical output given by said first and second optical output setting means;

a third detecting means for detecting the first setting value signal among outputs of said optical output setting switching means;

a fourth detecting means for detecting the second setting value signal among the outputs of said optical output setting switching means;

a first comparing means for comparing the detected output of said first detecting means with the detected output of said third detecting means and outputting the comparison result;

a second comparing means for comparing the detected output of said second detecting means with the detected output of said fourth detecting means and outputting the comparison result;

a second switching means for switching and outputting the comparison results of said first and second comparing means in synchronization with the switching by said first switching means; and a current supplying means for supplying said drive current in accordance with the output signal of said second switching means to said semiconductor laser.

2. A semiconductor laser optical output control circuit as set forth in claim 1, wherein:

said first detecting means and third detecting means include peak value detection circuits, and said second detecting means and fourth detecting means include bottom value detection circuits.

3. A semiconductor laser optical output control circuit as set forth in claim 2, wherein:

the peak value detection circuits of said first detecting means and third detecting means have substantially the same circuit output characteristics, and the bottom value detection circuits of said second detecting means and fourth detecting means have substantially the same circuit output characteristics.

4. A semiconductor laser optical output control circuit as set forth in claim 1, wherein:

the circuit comprises of first and second hold circuits for holding the comparison results output by said first and second comparing means, and said second switching means switches said comparison results held by said first and second hold circuits and supplies said switched comparison results to said current supplying means.

5. A semiconductor laser optical output control circuit as set forth in claim 1, wherein:

said optical output setting means gives the setting value of said semiconductor laser as a reference voltage value.

6. A semiconductor laser optical output control circuit as set forth in claim 1, wherein:

said optical output setting means gives the setting value of said semiconductor laser as a reference current value.

7. A semiconductor laser optical output control circuit for controlling an optical output of a semiconductor laser to a desired intensity in accordance with a supplied drive current, comprising:

an optical output detecting means for detecting the optical output of said semiconductor laser;

a first detecting means for detecting a first level of said optical output detected by said optical output detecting means;

a second detecting means for detecting a second level of said optical output detected by said optical output detecting means;

a third detecting means for detecting a third level intermediate between said first level and second level of said optical outputs detected by said optical output detecting means;

a first optical output setting means for giving a first setting value of a first level in the optical output of said semiconductor laser;

a second optical output setting means for giving a second setting value of a second level in the optical output of said semiconductor laser;

at least one third optical output setting means for giving a third setting value of a third level in the optical output of said semiconductor laser;

a first switching means for switching and outputting the first, second, and third setting value signals of said optical outputs given by said first, second, and third optical output setting means;

a fourth detecting means for detecting the first setting signal among the outputs of said optical output setting switching means;

a fifth detecting means for detecting the second setting signal among the outputs of said optical output setting switching means;

at least a sixth detecting means for detecting the third setting value signal among the outputs of said optical output setting switching means;

a first comparing means for comparing the detected output of said first detecting means with the detected output of said fourth detecting means and outputting the comparison result;

a second comparing means for comparing the detected output of said second detecting means with the detected output of said fifth detecting means and outputting the comparison result;

at least one third comparing means for comparing the detected output of said third detecting means with the detected output of said sixth detecting means and outputting the comparison result;

a second switching means for switching and outputting the comparison results of said first, second, and third comparing means in synchronization with the switching by said first switching means; and a current supplying means for supplying said drive current in accordance with the output signal of said second switching means to said semiconductor laser.

8. A semiconductor laser optical output control circuit as set forth in claim 7, wherein:

said first detecting means and fourth detecting means include peak value detection circuits, and said second detecting means and fifth detecting means include bottom value detection circuits.

9. A semiconductor laser optical output control circuit as set forth in claim 8, wherein:

said third detecting means and sixth detecting means include mean value detection circuits.

10. A semiconductor laser optical output control circuit as set forth in claim 8, wherein:

the peak value detection circuits of said first detecting means and third detecting means have substantially the same circuit output characteristics, and the bottom value detection circuits of said second detecting means and fourth detecting means have substantially the same circuit output characteristics.

11. A semiconductor laser optical output control circuit as set forth in claim 9, wherein:

the peak value detection circuits of said first detecting means and fourth detecting means have substantially the same circuit output characteristics, the bottom value detection circuits of said second detecting means and fifth detecting means have substantially the same circuit output characteristics, and the mean value detection circuits of said third detecting means and sixth detecting means have substantially the same circuit output characteristics.

12. A semiconductor laser optical output control circuit as set forth in claim 9, wherein:
at least the mean value detection circuit among said peak value detection circuit, bottom value detection circuit, and mean value detection circuit has a hold function.

13. A semiconductor laser optical output control circuit as set forth in claim 7, wherein:
said first, second, and third comparing means have a hold function.

14. A semiconductor laser optical output control circuit as set forth in claim 12, wherein:
said first, second, and third comparing means have a hold function.

15. A semiconductor laser optical output control circuit as set forth in claim 7, wherein:
the circuit comprises first, second, and third hold circuits for holding the comparison results output of said first, second, and third comparing means, and
said second switching means switches said comparison results held by said first, second, and third hold circuits and supplies said switched comparison result to said current supplying means.

16. A semiconductor laser optical output control circuit as set forth in claim 7, wherein:
said optical output setting means gives the setting value of said semiconductor laser as a reference voltage value.

17. A semiconductor laser optical output control circuit as set forth in claim 7, wherein:
said optical output setting means gives the setting value of said semiconductor laser as a reference current value.

18. An optical device comprising a semiconductor laser optical output control circuit for controlling an optical output of the semiconductor laser emitted to an optical medium to a desired intensity in accordance with a supplied drive current, wherein:
said semiconductor laser optical output control circuit comprises:
an optical output detecting means for detecting the optical output of said semiconductor laser;
a first detecting means for detecting a first level of said optical output detected by said optical output detecting means;
a second detecting means for detecting a second level of said optical output detected by said optical output detecting means;
a first optical output setting means for giving a first setting value of a first level in the optical output of said semiconductor laser;
a second optical output setting means for giving a second setting value of a second level in the optical output of said semiconductor laser;
a first switching means for switching and outputting first and second setting value signals of said optical output given by said first and second optical output setting means;
a third detecting means for detecting the first setting value signal among outputs of said optical output setting switching means;
a fourth detecting means for detecting the second setting value signal among the outputs of said optical output setting switching means;
a first comparing means for comparing the detected output of said first detecting means with the detected output of said third detecting means and outputting the comparison result;
a second comparing means for comparing the detected output of said second detecting means with the detected output of said fourth detecting means and outputting the comparison result;
a second switching means for switching and outputting the comparison results of said first and second comparing means in synchronization with the switching by said first switching means; and
a current supplying means for supplying said drive current in accordance with the output signal of said second switching means to said semiconductor laser.

19. An optical device comprising a semiconductor laser optical output control circuit for controlling an optical output of a semiconductor laser emitted to an optical medium to a desired intensity in accordance with a supplied drive current, wherein:
said semiconductor laser optical output control circuit comprises:
an optical output detecting means for detecting the optical output of said semiconductor laser;
a first detecting means for detecting a first level of said optical output detected by said optical output detecting means;
a second detecting means for detecting a second level of said optical output detected by said optical output detecting means;
a third detecting means for detecting a third level intermediate between said first level and second level of said optical outputs detected by said optical output detecting means;
a first optical output setting means for giving a first setting value of a first level in the optical output of said semiconductor laser;
a second optical output setting means for giving a second setting value of a second level in the optical output of said semiconductor laser;
at least one third optical output setting means for giving a third setting value of a third level in the optical output of said semiconductor laser;
a first switching means for switching and outputting the first, second, and third setting value signals of said optical outputs given by said first, second, and third optical output setting means;
a fourth detecting means for detecting the first setting value signal among the outputs of said optical output setting switching means;
a fifth detecting means for detecting the second setting value signal among the outputs of said optical output setting switching means;
at least a sixth detecting means for detecting the third setting value signal among the outputs of said optical output setting switching means;
a first comparing means for comparing the detected output of said first wave detecting mean with the detected output of said fourth detecting means and outputting the comparison result;
a second comparing means for comparing the detected output of said second detecting means with the detected output of said fifth detecting means and outputting the comparison result;
at least one third comparing means for comparing the detected output of said third detecting means with the detected output of said sixth detecting means and outputting the comparison result;
a second switching means for switching and outputting the comparison results of said first, second, and third comparing means in synchronization with the switching by said first switching means; and
a current supplying means for supplying said drive current in accordance with the output signal of said second switching means to said semiconductor laser.

* * * * *